(12) United States Patent
Yamamoto et al.

(10) Patent No.: US 8,159,290 B2
(45) Date of Patent: *Apr. 17, 2012

(54) TEST APPARATUS, DEMODULATION APPARATUS, TEST METHOD, DEMODULATION METHOD AND ELECTRIC DEVICE

(75) Inventors: Kazuhiro Yamamoto, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 60 days.

This patent is subject to a terminal disclaimer.

(21) Appl. No.: 12/820,054

(22) Filed: Jun. 21, 2010

(65) Prior Publication Data

US 2010/0327967 A1    Dec. 30, 2010

(30) Foreign Application Priority Data

Mar. 21, 2008    (JP) ................................ 2008-073170

(51) Int. Cl.
H03D 1/00    (2006.01)
H03D 3/02    (2006.01)
G01R 25/00    (2006.01)

(52) U.S. Cl. ........ 329/360; 329/307; 329/345; 329/347; 702/79

(58) Field of Classification Search .......... 329/304–310, 329/347; 332/103–105, 144, 145, 149, 151; 324/76.11, 76.12, 118
See application file for complete search history.

(56) References Cited

U.S. PATENT DOCUMENTS

| | | | |
|---|---|---|---|
| 5,369,378 A | 11/1994 | Kosaka et al. | |
| 5,875,213 A | 2/1999 | Asami et al. | |
| 7,902,918 B2 * | 3/2011 | Yamamoto et al. | 329/360 |
| 2004/0122620 A1 | 6/2004 | Doi et al. | |
| 2010/0066443 A1 | 3/2010 | Yamamoto et al. | |

FOREIGN PATENT DOCUMENTS

| | | |
|---|---|---|
| JP | 5-292135 A | 11/1993 |
| JP | 8-274823 A | 10/1996 |
| JP | 2002-139556 A | 5/2002 |

(Continued)

OTHER PUBLICATIONS

Jain, "GHz Interconnects—Electrical Aspects," International Test Conference NOTES Tutorial 3, Oct. 22, 2006, p. 27, Santa Clara, California, USA. Mentioned on p. 1 of as-filed specification.

(Continued)

*Primary Examiner* — David Mis
(74) *Attorney, Agent, or Firm* — Chen Yoshimura LLP

(57) ABSTRACT

Provided is a test apparatus for testing a device under test that outputs, as an output signal, an amplitude-phase modulated signal having a level and a transition point phase selected from among a plurality of levels and a plurality of phases according to transmission data, the test apparatus comprising a comparing section that compares the output signal to a first comparison level, which is less than the expected level, before the expected phase, and compares the output signal to a second comparison level, which is greater than the expected level, and to a third comparison level, which is less than the expected level, after the expected phase; and a judging section that judges that the output signal matches the expected values on a condition that (i) the output signal is less than or equal to the first comparison level before the expected phase and (ii) the output signal is less than or equal to the second comparison level and greater than or equal to the third comparison level after the expected phase.

24 Claims, 14 Drawing Sheets

FOREIGN PATENT DOCUMENTS

| | | |
|---|---|---|
| JP | 2003-315369 A | 11/2003 |
| WO | 02/103379 A1 | 12/2002 |
| WO | 2008/123470 A1 | 10/2008 |

OTHER PUBLICATIONS

International Search Report (ISR) issued in PCT/JP2009/000989 (parent application) for Examiner consideration, citing U.S. Patent Nos. 1-2, U.S. Patent Application Publication No. 1 and Foreign Patent document Nos. 1-6 listed above.

Written Opinion (PCT/ISA/237) issued in PCT/JP2009/000989 (parent application). Concise Explanation of Relevance: This Written Opinion considers the claims are described by or obvious over the references Nos. 1-5 cited in ISR above.

Written Opinion (PCT/ISA/237) issued in PCT/JP2009/000989 (parent application) mailed in May 2009.

* cited by examiner

TEST APPARATUS, DEMODULATION APPARATUS, TEST METHOD, DEMODULATION METHOD AND ELECTRIC DEVICE

BACKGROUND

1. Technical Field

The present invention relates to a test apparatus, a demodulation apparatus, a test method, a demodulation method, and an electronic device. In particular, the present invention relates to a test apparatus, a test method, and an electronic device for testing a device under test that outputs an amplitude-phase modulated signal as an output signal, and to a demodulation apparatus and a demodulation method for demodulating the amplitude-phase modulated signal.

2. Related Art

Along with the increase in operating speed and circuit density of semiconductors, the amount of data transmitted within a semiconductor is also increasing rapidly. The amount of data transmitted within a semiconductor cannot keep pace with the necessary increases because of restrictions due to the number of pins, shape, wiring, and the like. Therefore, there is a large gap between the amount of data transmitted within a semiconductor and the amount of data transmitted outside the semiconductor.

To solve this problem, one proposal involves performing data transmission between semiconductors using an amplitude-phase modulated signal having a level and a transition point phase selected from among a plurality of levels and transition point phases according to the transmission data, as shown in Non-Patent Document 1. With such an amplitude-phase modulated signal, many bits of data can be transmitted in a single cycle, and so the gap between the data transmission amount inside and outside of a semiconductor can be decreased.

Non-Patent Document 1: Sunil Jain, "GHz Interconnects—Electrical Aspects," International Test Conference NOTES Tutorial 3, US, Oct. 22, 2006, page 27

A test apparatus acquires from a device under test a binary signal that changes between H and L according to the transmission data, and compares the logic level of this binary value to an expected value. In other words, for each prescribed cycle, the test apparatus detects whether the signal is higher than a logic H threshold level or lower than a logic L threshold level at a designated first timing, and compares the detected results to the expected values. However, this test apparatus cannot achieve this detection for an amplitude-phase modulated signal whose phase and level changes every cycle, and so the test apparatus cannot test a device under test that outputs an amplitude-phase modulated signal.

Therefore, it is an object of an aspect of the innovations herein to provide a test apparatus, a demodulation apparatus, a test method, a demodulation method, and an electronic device, which are capable of overcoming the above drawbacks accompanying the related art. The above and other objects can be achieved by combinations described in the independent claims. The dependent claims define further advantageous and exemplary combinations of the innovations herein.

SUMMARY

According to a first aspect related to the innovations herein, one exemplary test apparatus may include a test apparatus for testing a device under test that outputs, as an output signal, an amplitude-phase modulated signal having a level and a transition point phase selected from among a plurality of levels and a plurality of phases according to transmission data, the test apparatus comprising a test signal output section that outputs a test signal to the device under test; a pattern generating section that generates an expected level, which is an expected value for a level of the output signal to be output from the device under test in response to the test signal, and an expected phase, which is an expected value for the transition point phase of the output signal; a comparing section that compares the output signal to a first comparison level, which is less than the expected level, before the expected phase, and compares the output signal to a second comparison level, which is greater than the expected level, and to a third comparison level, which is less than the expected level, after the expected phase; and a judging section that judges that the output signal matches the expected values on a condition that (i) the output signal is less than or equal to the first comparison level before the expected phase and (ii) the output signal is less than or equal to the second comparison level and greater than or equal to the third comparison level after the expected phase.

According to a second aspect related to the innovations herein, one exemplary test apparatus may include a test apparatus for testing a device under test that outputs, as an output signal, an amplitude-phase modulated signal having a level and a transition point phase selected from among a plurality of levels and a plurality of phases according to transmission data, the test apparatus comprising a test signal output section that outputs a test signal to the device under test; a pattern generating section that generates an expected level, which is an expected value for a level of the output signal to be output from the device under test in response to the test signal, and an expected phase, which is an expected value for the transition point phase of the output signal; a comparing section that compares the output signal to a fifth comparison level, which is greater than the expected level, and to a sixth comparison level, which is less than the expected level, before the expected phase, and compares the output signal to a fourth comparison level, which is less than the expected level, after the expected phase; and a judging section that judges that the output signal matches the expected values on a condition that (i) the output signal is less than or equal to the fifth comparison level and greater than or equal to the sixth comparison level before the expected phase and (ii) the output signal is less than or equal to the fourth comparison level after the expected phase.

According to a third aspect related to the innovations herein, one exemplary demodulation apparatus may include a demodulation apparatus that demodulates an amplitude-phase modulated signal having a level and a transition point phase selected from among a plurality of levels and phases according to transmission data, the demodulation apparatus comprising a level comparison circuit that outputs a plurality of level comparison results obtained by comparing, for each of the levels that the received amplitude-phase modulated signal can have, (i) the amplitude-phase modulated signal to (ii) each of a first comparison level, which is less than the corresponding level, and a second comparison level, which is greater than the corresponding level; an acquiring section that acquires the level comparison results obtained by the level comparison circuit, for each of the phases that the amplitude-phase modulated signal can have, at each of a first comparison timing, which is before the corresponding phase, and a second comparison timing, which is after the corresponding phase; a detecting section that detects a level and a transition point phase that cause the amplitude-phase modulated signal to be less than or equal to the first comparison level at the first comparison timing and to be less than or equal to the second comparison level and greater than or equal to the first comparison level at the second comparison timing, based on the level comparison results acquired by the acquiring section; and a data output section that outputs data corresponding to the level and transition point detected by the detecting section.

According to a fourth aspect related to the innovations herein, one exemplary demodulation apparatus may include a demodulation apparatus that demodulates an amplitude-phase modulated signal having a level and a transition point phase selected from among a plurality of levels and phases according to transmission data, the demodulation apparatus comprising a level comparison circuit that outputs a plurality of level comparison results obtained by comparing, for each of the levels that the received amplitude-phase modulated signal can have, (i) the amplitude-phase modulated signal to (ii) each of a fourth comparison level, which is less than the corresponding level, and a fifth comparison level, which is greater than the corresponding level; an acquiring section that acquires the level comparison results obtained by the level comparison circuit, for each of the phases that the amplitude-phase modulated signal can have, at each of a fourth comparison timing, which is after the corresponding phase, and a fifth comparison timing, which is before the corresponding phase; a detecting section that detects a level and a transition point phase that cause the amplitude-phase modulated signal to be less than or equal to the fourth comparison level at the fourth comparison timing and to be less than or equal to the fifth comparison level and greater than or equal to the fourth comparison level at the fifth comparison timing, based on the level comparison results acquired by the acquiring section; and a data output section that outputs data corresponding to the level and transition point detected by the detecting section.

According to a fifth aspect related to the innovations herein, one exemplary test method may include a test method for testing a device under test that outputs, as an output signal, an amplitude-phase modulated signal having a level and a transition point phase selected from among a plurality of levels and a plurality of phases according to transmission data, the test method comprising outputting a test signal to the device under test; generating an expected level, which is an expected value for a level of the output signal to be output from the device under test in response to the test signal, and an expected phase, which is an expected value for the transition point phase of the output signal; comparing the output signal to a first comparison level, which is less than the expected level, before the expected phase, and compares the output signal to a second comparison level, which is greater than the expected level, and to a third comparison level, which is less than the expected level, after the expected phase; and judging that the output signal matches the expected values on a condition that (i) the output signal is less than or equal to the first comparison level before the expected phase and (ii) the output signal is less than or equal to the second comparison level and greater than or equal to the third comparison level after the expected phase.

According to a sixth aspect related to the innovations herein, one exemplary test method may include a test method for testing a device under test that outputs, as an output signal, an amplitude-phase modulated signal having a level and a transition point phase selected from among a plurality of levels and a plurality of phases according to transmission data, the test method comprising outputting a test signal to the device under test; generating an expected level, which is an expected value for a level of the output signal to be output from the device under test in response to the test signal, and an expected phase, which is an expected value for the transition point phase of the output signal; comparing the output signal to a fifth comparison level, which is greater than the expected level, and to a sixth comparison level, which is less than the expected level, before the expected phase, and compares the output signal to a fourth comparison level, which is less than the expected level, after the expected phase; and judging that the output signal matches the expected values on a condition that (i) the output signal is less than or equal to the fifth comparison level and greater than or equal to the sixth comparison level before the expected phase and (ii) the output signal is less than or equal to the fourth comparison level after the expected phase.

According to a seventh aspect related to the innovations herein, one exemplary demodulation method may include a demodulation method for demodulating an amplitude-phase modulated signal that has a level and a transition point phase selected from among a plurality of levels and phases according to transmission data, the demodulation method comprising outputting a plurality of level comparison results obtained by comparing, for each of the levels that the received amplitude-phase modulated signal can have, (i) the amplitude-phase modulated signal to (ii) each of a first comparison level, which is less than the corresponding level, and a second comparison level, which is greater than the corresponding level; acquiring the level comparison results obtained by the level comparison circuit, for each of the phases that the amplitude-phase modulated signal can have, at each of a first comparison timing, which is before the corresponding phase, and a second comparison timing, which is after the corresponding phase; detecting a level and a transition point phase that cause the amplitude-phase modulated signal to be less than or equal to the first comparison level at the first comparison timing and to be less than or equal to the second comparison level and greater than or equal to the first comparison level at the second comparison timing, based on the acquired level comparison results; and outputting data corresponding to the detected level and transition point.

According to an eighth aspect related to the innovations herein, one exemplary test apparatus may include a demodulation method for demodulating an amplitude-phase modulated signal that has a level and a transition point phase selected from among a plurality of levels and phases according to transmission data, the demodulation method comprising outputting a plurality of level comparison results obtained by comparing, for each of the levels that the received amplitude-phase modulated signal can have, (i) the amplitude-phase modulated signal to (ii) each of a fourth comparison level, which is less than the corresponding level, and a fifth comparison level, which is greater than the corresponding level; acquiring the level comparison results obtained by the level comparison circuit, for each of the phases that the amplitude-phase modulated signal can have, at each of a fourth comparison timing, which is after the corresponding phase, and a fifth comparison timing, which is before the corresponding phase; detecting a level and a transition point phase that cause the amplitude-phase modulated signal to be less than or equal to the fourth comparison level at the fourth comparison timing and to be less than or equal to the fifth comparison level and greater than or equal to the fourth comparison level at the fifth comparison timing, based on the acquired level comparison results; and outputting data corresponding to the detected level and transition point.

According to a ninth aspect related to the innovations herein, one exemplary electronic device may include an electronic device comprising a circuit under test that outputs, as an output signal, an amplitude-phase modulated signal having a level and a transition point phase selected from among a plurality of levels and a plurality of phases according to transmission data; and a test circuit that tests the circuit under test. The test circuit includes a test signal output section that outputs a test signal to the circuit under test; a pattern generating section that generates an expected level, which is an expected value for a level of the output signal to be output from the circuit under test in response to the test signal, and an expected phase, which is an expected value for the transition point phase of the output signal; a comparing section that compares the output signal to a first comparison level, which is less than the expected level, before the expected phase, and compares the output signal to a second comparison level, which is greater than the expected level, and to a third comparison level, which is less than the expected level, after the expected phase; and a judging section that judges that the output signal matches the expected values on a condition that (i) the output signal is less than or equal to the first comparison level before the expected phase and (ii) the output signal is less than or equal to the second comparison level and greater than or equal to the third comparison level after the expected phase.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
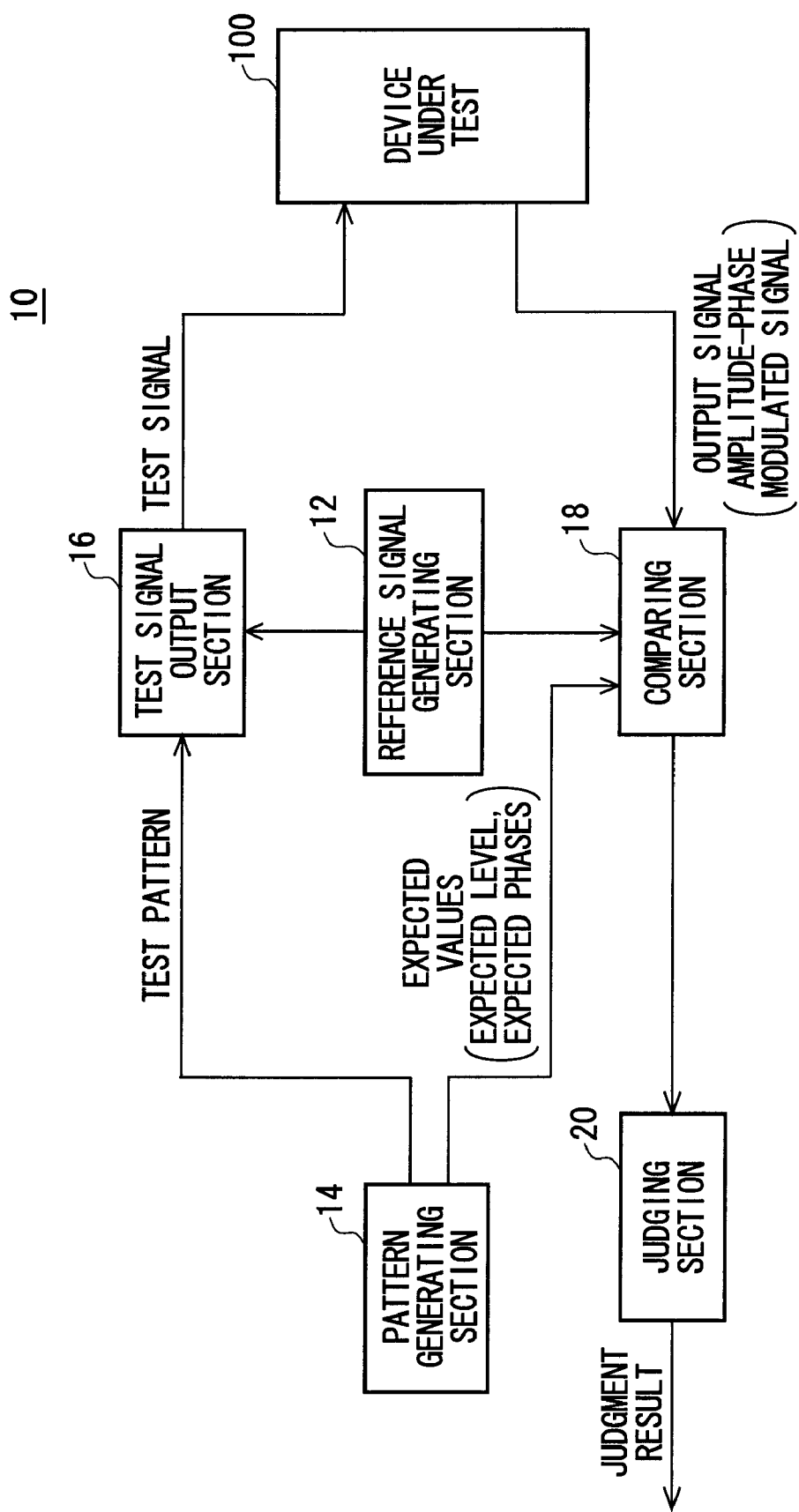
FIG. 1 shows a test apparatus 10 according to an embodiment of the present invention, along with a device under test 100.

FIG. 1 shows a test apparatus 10 according to an embodiment of the present invention, along with a device under test 100. The test apparatus 10 tests the device under test 100.

The test apparatus 10 includes a reference signal generating section 12, a pattern generating section 14, a test signal output section 16, a comparing section 18, and a judging section 20. The reference signal generating section 12 generates a reference signal with a period corresponding to a test cycle.

The pattern generating section 14 generates a test pattern that designates a pattern of the test signal to be output to the device under test 100. The pattern generating section 14 generates an expected value of an output signal to be output from the device under test 100 in response to the test signal.

The test signal output section 16 generates the test signal according to the test pattern and the reference signal, and outputs the generated test signal to the device under test 100. The comparing section 18 receives the output signal output by the device under test 100 in response to the test signal, and compares this output signal to the expected value. The judging section 20 judges whether the output signal matches the expected value, based on the comparison result from the comparing section 18. The judging section 20 outputs the judgment result.

Figure 2:
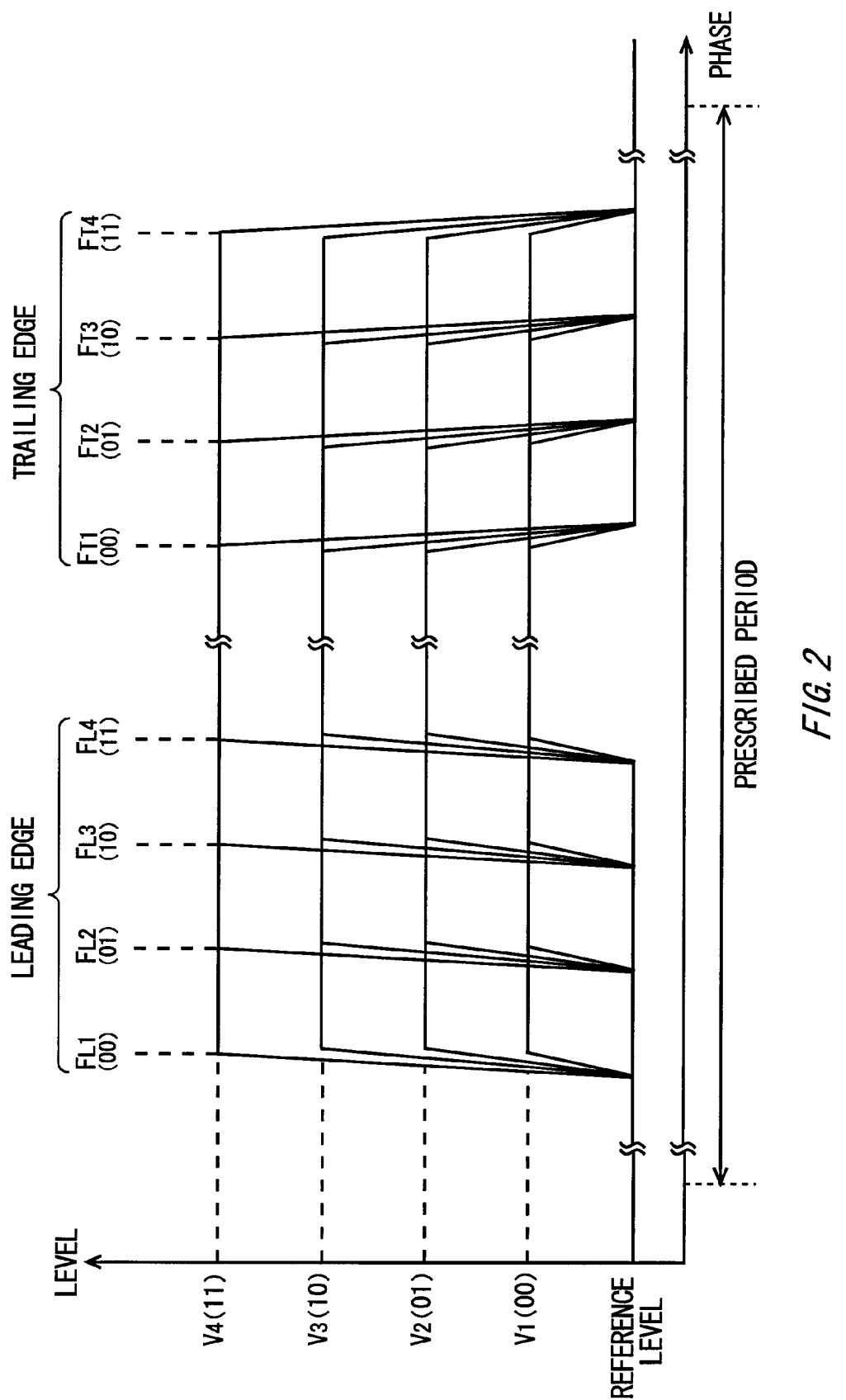
FIG. 2 shows an exemplary amplitude-phase modulated signal according to the present embodiment.

FIG. 2 shows an exemplary amplitude-phase modulated signal according to the present embodiment. The device under test 100 outputs, as the output signal, an amplitude-phase modulated signal having a level and a transition point phase that are selected from among a plurality of levels and transition point phases according to transmission data.

For example, the device under test 100 may output an amplitude-phase modulated signal that is a pulse signal in synchronization with a prescribed period and that has a pulse level and a pulse edge phase that change according to the transmission data. In other words, the device under test 100 may output, for each cycle, an amplitude-phase modulated signal having a pulse level that is selected from among a plurality of predetermined pulse levels according to the transmission data. Furthermore, the device under test 100 may output, for each cycle, an amplitude-phase modulated signal in which at least one of the transition point of a leading edge of the pulse and a transition point of a trailing edge of the pulse is selected from among a plurality of phases that are predetermined for the cycle.

The device under test 100 may output, for each cycle, an amplitude-phase modulated signal for which $n_1$ levels ($V_1, V_2, V_3, \ldots, V_{n1}$) can be acquired as pulse levels, where $n_1$ is an integer greater than 1. The device under test 100 may output, for each cycle, an amplitude-phase modulated signal for which $n_2$ phases ($F_{L1}, F_{L2}, F_{L3}, \ldots, F_{Ln2}$) can be acquired as phases of the leading edge, where $n_2$ is an integer greater than 1. The device under test 100 may output, for each cycle, an amplitude-phase modulated signal for which $n_3$ phases ($F_{T1}, F_{T2}, F_{T3}, \ldots, F_{Tn3}$) can be acquired as phases of the trailing edge, where $n_3$ is an integer greater than 1.

With the amplitude-phase modulated signal as described above, multi-valued data can be transmitted in each prescribed cycle. For example, if the amplitude-phase modulated signal has $n_1$ levels, $n_2$ leading edge phases, and $n_3$ trailing edge phases, data having ($n_1 \times n_2 \times n_3$) values can be output in a single cycle.

Figure 3:
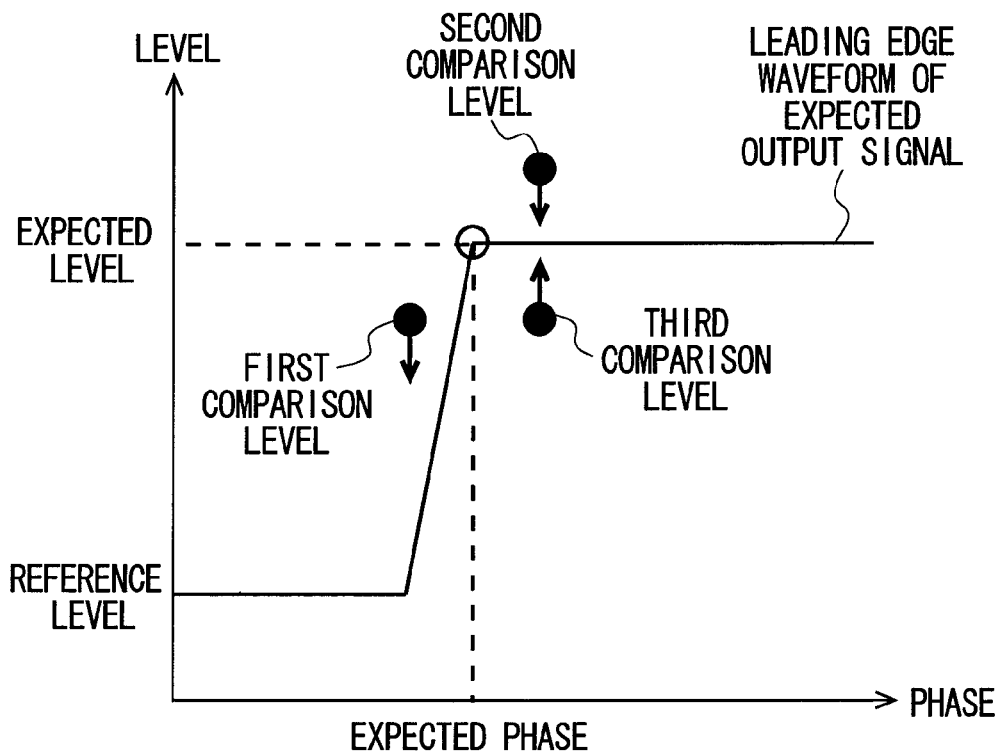
FIG. 3 shows an exemplary leading edge waveform of an expected output signal, and exemplary comparison levels and comparison timings for comparing the leading edge of the output signal to the expected values.

FIG. 3 shows an exemplary leading edge waveform of an expected output signal, and exemplary comparison levels and comparison timings for comparing the leading edge of the output signal to the expected values. The pattern generating section 14 generates the expected value for the output signal, i.e. the amplitude-phase modulated signal. More specifically, the pattern generating section 14 generates (i) an expected level indicating the expected value for the level of the output signal to be output from the device under test 100 in response to the test signal and (ii) an expected phase indicating the expected value for the transition point phase of this output signal. For each pulse generated in each prescribed cycle, the pattern generating section 14 may generate an expected level, an expected phase for a leading edge, and an expected phase for a trailing edge.

For each cycle, the comparing section 18 makes a comparison between the expected values generated by the pattern generating section 14 and the output signal output by the device under test 100 in response to the test signal. More specifically, when data is modulated at the leading edge phase of the output signal, as shown in FIG. 3, the comparing section 18 makes a comparison, in each cycle, between the output signal and a first comparison level that is less than the expected level at a phase earlier than the expected phase, and between (i) the output signal and (ii) a second comparison level that is greater than the expected level and a third comparison level that is less than the expected level at a phase later than the expected phase.

Here, the comparing section 18 compares the output signal to the first comparison level at a phase earlier than the expected phase, and can therefore detect that the output signal is less than the expected level prior to the expected phase. Furthermore, the comparing section 18 compares the output signal to the third comparison level at a phase later than the expected phase, and can therefore detect that the output signal is greater than or equal to the expected level after the expected phase. Accordingly, the comparing section 18 can detect that the leading edge phase of the output signal substantially matches the expected phase that is after the comparison timing with the first comparison level and before the comparison timing with the third comparison level.

Since the comparing section 18 compares the output signal to both the second comparison level and the third comparison level after the expected phase, the comparing section 18 can detect that the level of the output signal substantially matches the expected level that is no greater than the second comparison level and no less than the third comparison level. The judging section 20 then judges whether the output signal matches the expected values, i.e. the expected level and the expected phase, based on the comparison results from the comparing section 18. More specifically, for each cycle, the judging section 20 judges that the output signal matches the expected values on a condition that the comparison results from the comparing section 18 indicate that the leading edge of the output signal is (i) less than or equal to the first comparison level before the expected phase and (ii) no greater than the second comparison level and no less than the third comparison level after the expected phase.

The first comparison level and the third comparison level are desirably less than the expected level and greater than a level, from among the plurality of levels that the output signal can have, that is one level lower than the expected level. The comparison timing for the first comparison level is preferably before the expected phase of the leading edge and after the phase that is immediately prior thereto from among the plurality of expected phases that the leading edge can take. For example, the comparing section 18 may compare the output signal to the third comparison level, which is substantially equal to the first comparison level, after the expected phase. Therefore, the comparing section 18 can use a shared comparison circuit.

The second comparison level is preferably greater than the expected level and less than a level, from among the plurality of levels that the output signal can have, that is one level higher than the expected level. The comparison timing for the second comparison level and the third comparison level is preferably after the expected phase and before the phase that is immediately subsequent thereto from among the plurality of expected phases that the leading edge can take. For example, the comparing section 18 may compare the output signal to the second comparison level and the third comparison level at substantially the same timing after the expected phase. Therefore, the comparing section 18 can use a shared comparison circuit.

In the present embodiment, the first level being greater than or equal to the second level means that that absolute value of the difference between the first level and a reference level, such as a ground, is greater than or equal to the absolute value of the difference between the second level and the reference level. Accordingly, the output signal being greater than or equal to a comparison level means that the absolute value of the difference between the output signal and the reference level is greater than or equal to the absolute value of the difference between the comparison level and the reference level. Similarly, the first level being less than or equal to the second level means that the absolute value of the difference between the first level and the reference level is less than or equal to the absolute value of the difference between the second level and the reference level.

Figure 4:
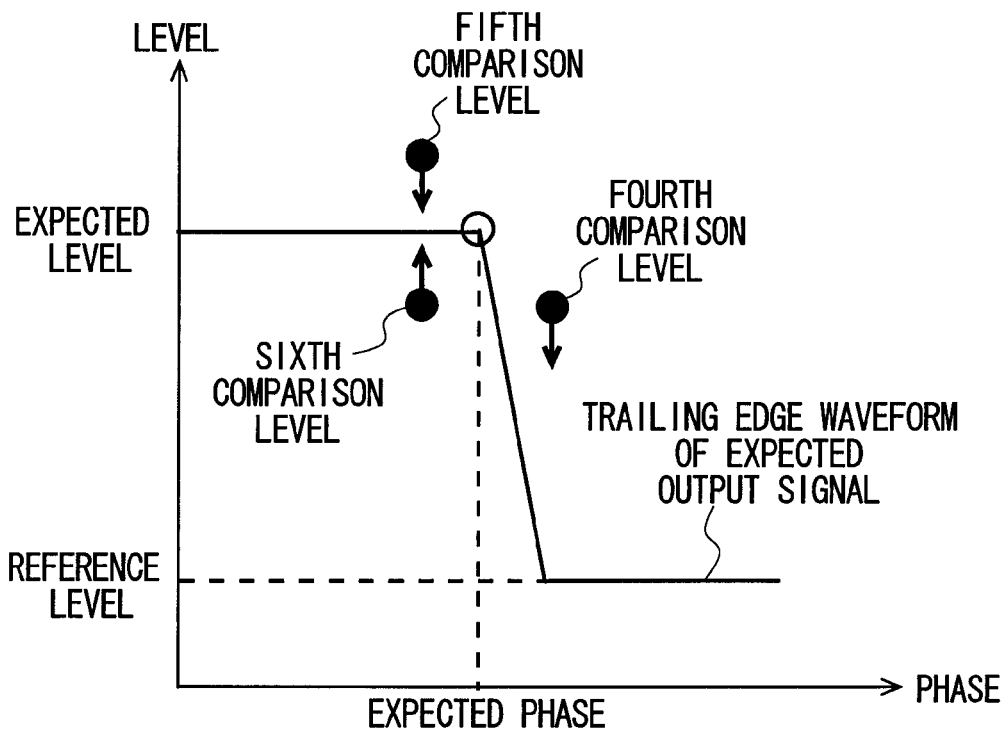
FIG. 4 shows an exemplary trailing edge waveform of an expected output signal, and exemplary comparison levels and comparison timings for comparing the trailing edge of the output signal to the expected values.

FIG. 4 shows an exemplary trailing edge waveform of an expected output signal, and exemplary comparison levels and comparison timings for comparing the trailing edge of the output signal to the expected values. More specifically, when data is modulated at the trailing edge phase of the output signal, as shown in FIG. 4, the comparing section 18 makes a comparison, in each cycle, between the output signal and a fourth comparison level that is less than the expected level at a phase later than the expected phase, and between (i) the output signal and (ii) a fifth comparison level that is greater than the expected level and a sixth comparison level that is less than the expected level at a phase earlier than the expected phase.

Here, the comparing section 18 compares the output signal to the fourth comparison level at a phase later than the expected phase, and can therefore detect that the output signal is less than the expected level after the expected phase. Furthermore, the comparing section 18 compares the output signal to the sixth comparison level at a phase earlier than the expected phase, and can therefore detect that the output signal is greater than or equal to the expected level before the expected phase. Accordingly, the comparing section 18 can detect that the trailing edge phase of the output signal substantially matches the expected phase that is before the comparison timing with the sixth comparison level and after the comparison timing with the fourth comparison level.

Since the comparing section 18 compares the output signal to both the fifth comparison level and the sixth comparison level before the expected phase, the comparing section 18 can detect that the level of the output signal substantially matches the expected level that is no greater than the fifth comparison level and no less than the sixth comparison level. For each cycle, the judging section 20 judges that the output signal matches the expected values on a condition that the comparison results from the comparing section 18 indicate that the trailing edge of the output signal is (i) less than or equal to the fourth comparison level after the expected phase and (ii) no greater than the fifth comparison level and no less than the sixth comparison level before the expected phase.

When comparing the output signal to the second comparison level using the leading edge, the comparing section 18 need not compare the output signal to the fifth comparison level using the trailing edge. Furthermore, when comparing the output signal to the fifth comparison level using the trailing edge, the comparing section 18 need not compare the output signal to the second comparison level using the leading edge.

The fourth comparison level and the sixth comparison level are desirably less than the expected level and greater than a level, from among the plurality of levels that the output signal can have, that is one level lower than the expected level. The comparison timing for the fourth comparison level is preferably after the expected phase of the trailing edge and before the phase that is immediately subsequent thereto from among the plurality of expected phases that the trailing edge can take. For example, the comparing section 18 may compare the output signal to the sixth comparison level, which is substantially equal to the fourth comparison level, before the expected phase. Therefore, the comparing section 18 can use a shared comparison circuit.

The fifth comparison level is preferably greater than the expected level and less than a level, from among the plurality of levels that the output signal can have, that is one level higher than the expected level. The comparison timing for the fifth comparison level and the sixth comparison level is preferably before the expected phase and after the phase that is immediately prior thereto from among the plurality of expected phases that the trailing edge can take. For example, the comparing section 18 may compare the output signal to the fifth comparison level and the sixth comparison level at substantially the same timing before the expected phase. Therefore, the comparing section 18 can use a shared comparison circuit.

The test apparatus 10 having the above configuration enables accurate testing of the device under test 100 that outputs an amplitude-phase modulated signal. For example, the test apparatus 10 can test the device under test 100 that outputs an amplitude-phase modulated signal whose pulse level, leading edge phase, and trailing edge phase change in each prescribed cycle.

Figure 5:
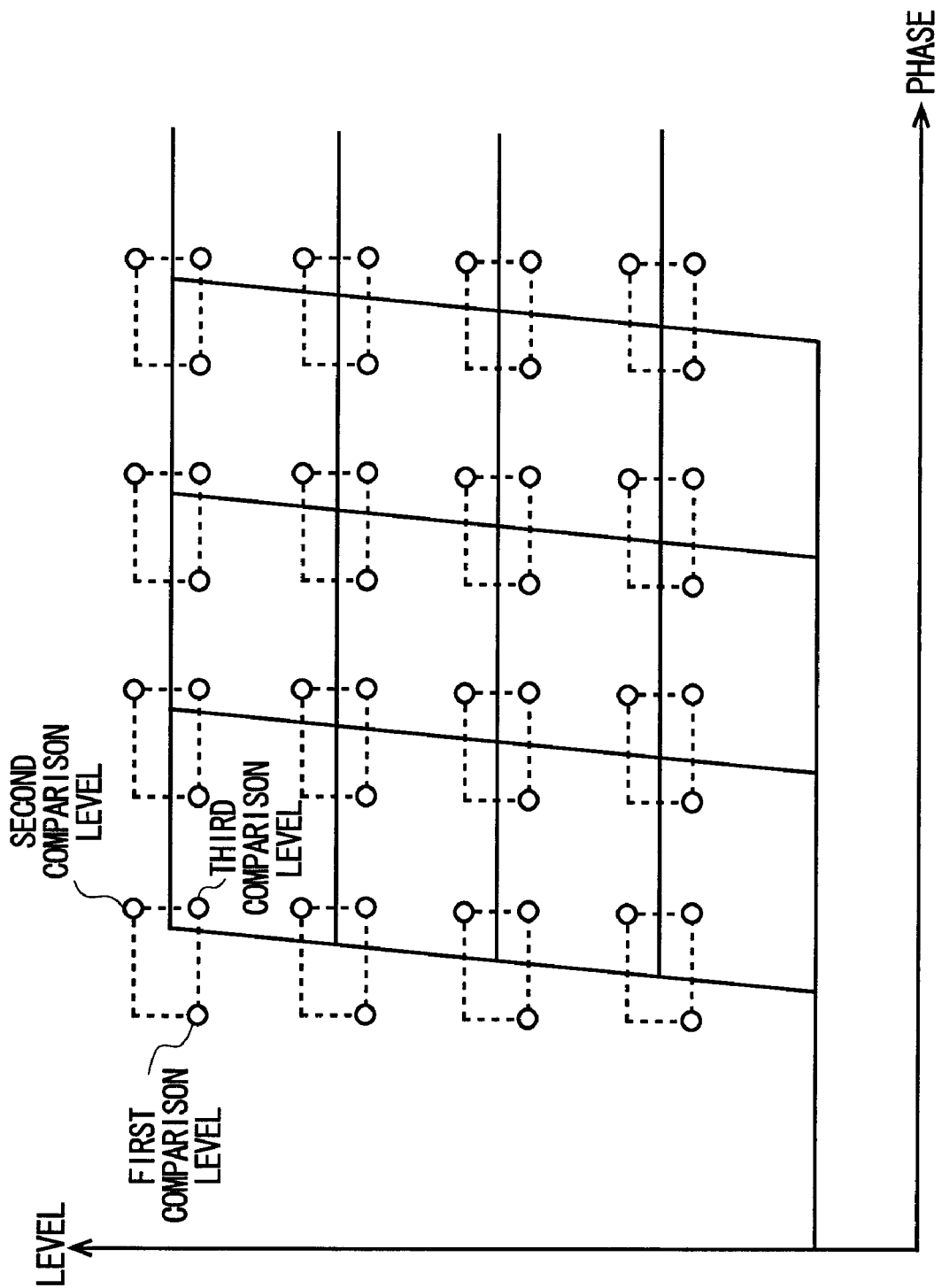
FIG. 5 shows comparison levels and comparison timings corresponding to each of a plurality of combinations of transition point phases and levels that the amplitude-phase modulated signal can have.

FIG. 5 shows comparison levels and comparison timings corresponding to each of a plurality of combinations of transition point phases and levels that the amplitude-phase modulated signal can have. The comparing section 18 may have first to third comparison levels (or fourth to sixth comparison levels) and comparison timings set in advance for each combination of a level and transition point phases, i.e. a leading edge phase and a trailing edge phase, that the output signal can have.

A plurality of comparison timings for the first comparison level (or the fourth comparison level) corresponding to the same transition point phase but different levels can be set in the comparing section 18 to have substantially the same phase, for example. A plurality of comparison timings for the second comparison level (or the fifth comparison level) corresponding to the same transition point phase but different levels can be set in the comparing section 18 to have substantially the same phase, for example. A plurality of comparison timings for the third comparison level (or the sixth comparison level) corresponding to the same transition point phase but different levels can be set in the comparing section 18 to have substantially the same phase, for example.

A plurality of first comparison levels (or fourth comparison levels) corresponding to the same level but different transition point phases can be set in the comparing section 18 to have substantially the same level, for example. A plurality of second comparison levels (or fifth comparison levels) corresponding to the same level but different transition point phases can be set in the comparing section 18 to have substantially the same level, for example. A plurality of third comparison levels (or sixth comparison levels) corresponding to the same level but different transition point phases can be set in the comparing section 18 to have substantially the same level, for example. With this comparing section 18, the level comparison circuit and the comparison timing control circuit can be shared.

Figure 6:
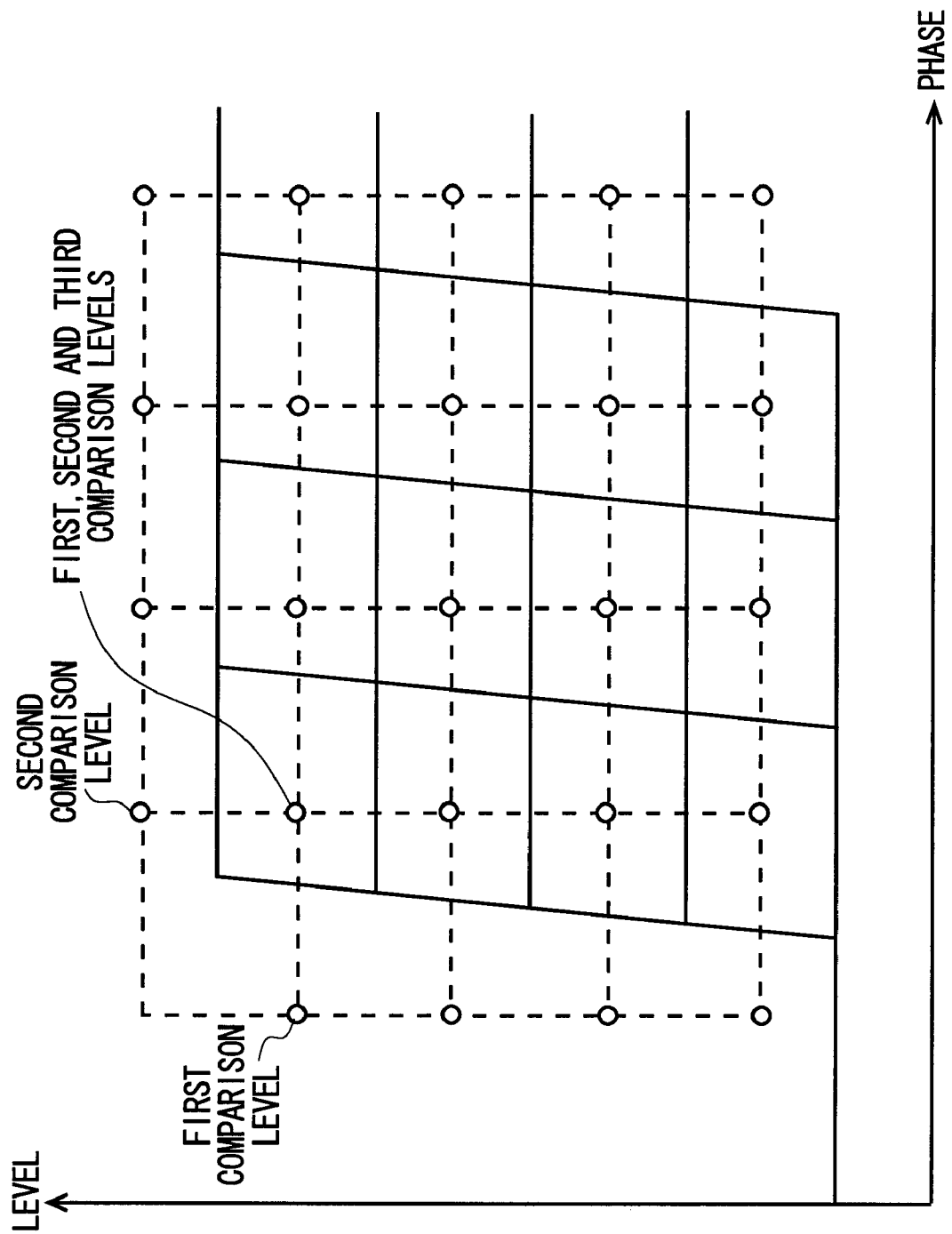
FIG. 6 shows exemplary comparison levels and comparison timings when adjacent levels and transition point phases are shared.

FIG. 6 shows exemplary comparison levels and comparison timings when adjacent levels and adjacent transition point phases are shared. Second comparison levels (or fifth comparison levels) corresponding to top levels and third comparison levels (or sixth comparison levels) corresponding to bottom levels, from among pairs of levels that are adjacent and that have the same transition point phase, can be set in the comparing section 18 to be substantially the same level.

Comparison timings for third comparison levels (or fourth comparison levels) corresponding to early phases and comparison timings for first comparison levels (or sixth comparison levels) corresponding to late phases, from among pairs of phases that are adjacent and that have the same level, can be set in the comparing section 18 to have substantially the same phase. Therefore, the comparing section 18 can further share circuits.

Figure 7:
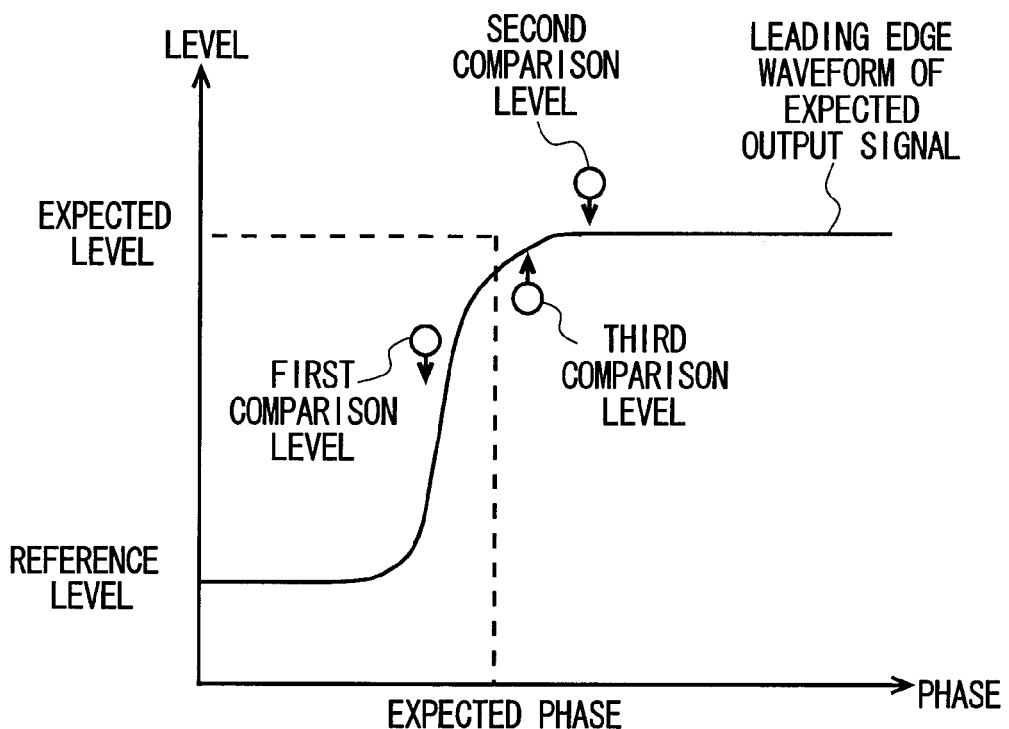
FIG. 7 shows an exemplary leading edge waveform having a delay, and exemplary comparison levels and comparison timings for comparing the leading edge of the output signal to the expected values.
Figure 8:
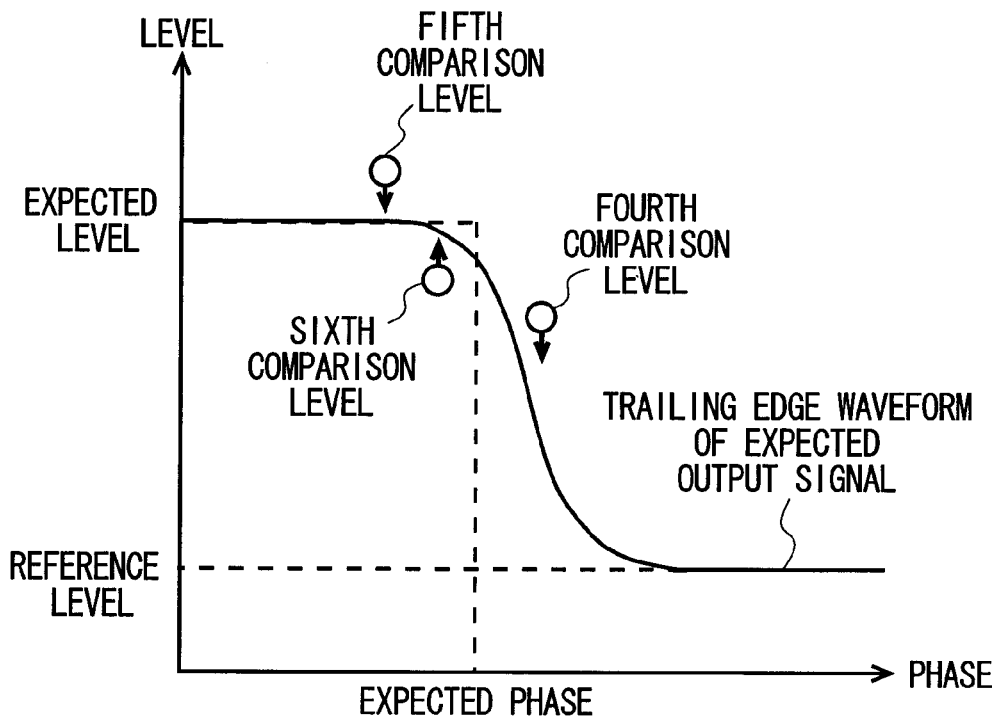
FIG. 8 shows an exemplary trailing edge waveform having a delay, and exemplary comparison levels and comparison timings for comparing the trailing edge of the output signal to the expected values.

FIG. 7 shows an exemplary leading edge waveform having a delay, and exemplary comparison levels and comparison timings for comparing the leading edge of the output signal to the expected values. FIG. 8 shows an exemplary trailing edge waveform having a delay, and exemplary comparison levels and comparison timings for comparing the trailing edge of the output signal to the expected values.

When data is modulated at the leading edge phase of the output signal, as shown in FIG. 7, the comparing section 18 makes a comparison between the output signal and the third comparison level that is greater than the first comparison level, at a phase later than the expected phase, for example. Furthermore, the comparing section 18 may compare the output signal to the second comparison level after comparing the output signal to the third comparison level. As a result, even when the waveform of the output signal is not sharp due to slow rising or falling of the leading edge, the comparing section 18 can compare the output signal to comparison levels that correspond to the output signal waveform, and can therefore obtain accurate comparison results.

When data is modulated at the trailing edge phase of the output signal, as shown in FIG. 8, the comparing section 18 makes a comparison between the output signal and the sixth comparison level that is greater than the fourth comparison level, at a phase earlier than the expected phase, for example. Furthermore, the comparing section 18 may compare the output signal to the sixth comparison level before comparing the output signal to the fifth comparison level. As a result, even when the waveform of the output signal is not sharp due to slow falling or rising of the trailing edge, the comparing section 18 can compare the output signal to comparison levels that correspond to the output signal waveform, and can therefore obtain accurate comparison results.

Figure 9:
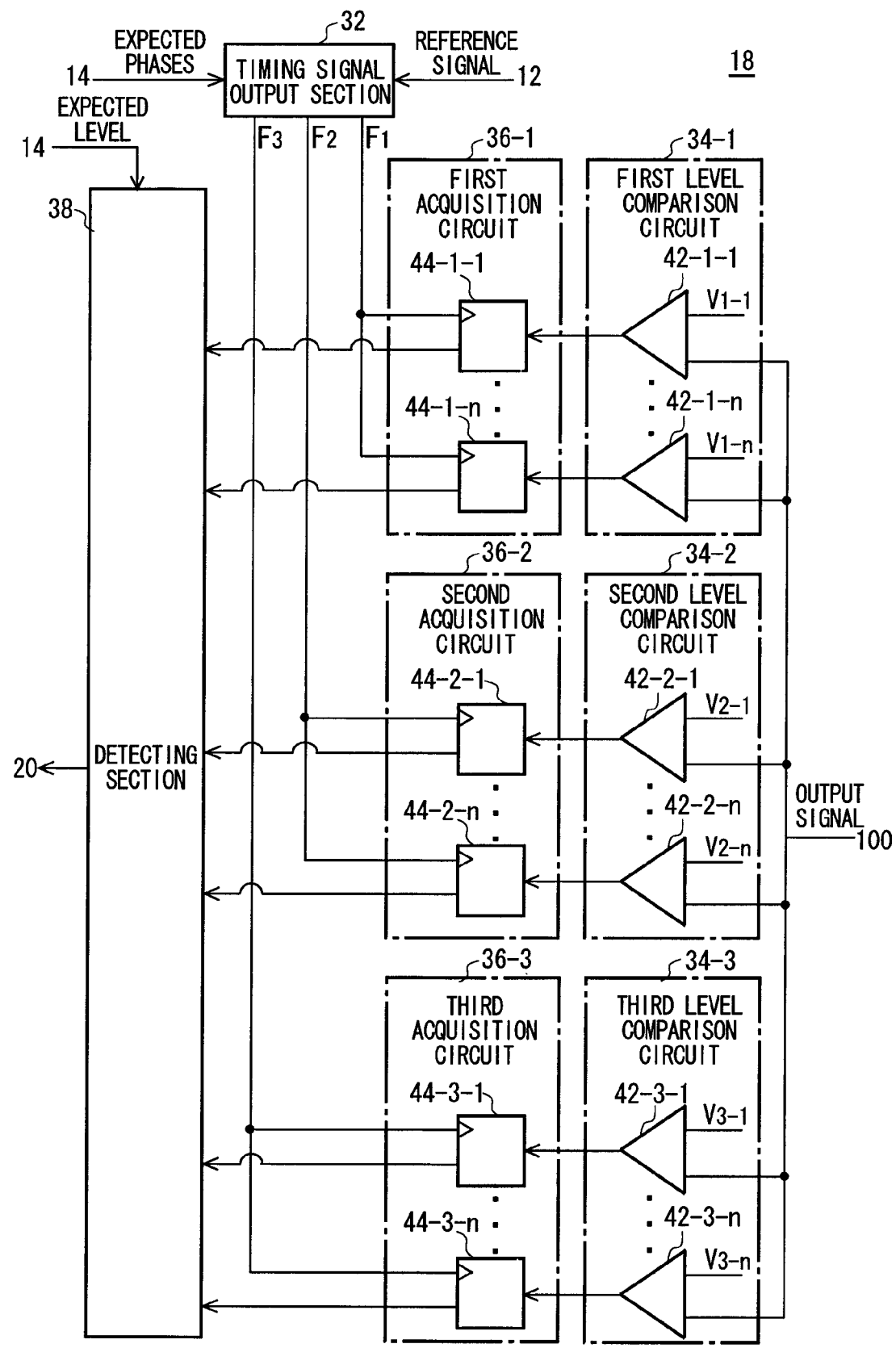
FIG. 9 shows a first exemplary configuration of the comparing section 18 according to an embodiment of the present invention.

FIG. 9 shows a first exemplary configuration of the comparing section 18 according to the present embodiment. The comparing section 18 in this first example includes a timing signal output section 32, first to third level comparison circuits 34-1 to 34-3, first to third acquisition circuits 36-1 to 36-3, and a detecting section 38.

The timing signal output section 32 receives an expected phase and a reference signal having a period corresponding to a test cycle. The timing signal output section 32 may receive, as the reference signal, a clock signal that is synchronized with the output signal.

The timing signal output section 32 outputs a first timing signal that indicates a first comparison timing at which the output signal is compared to the first comparison level corresponding to the expected phase. The timing signal output section 32 outputs a second timing signal that indicates a second comparison timing at which the output signal is compared to the second comparison level corresponding to the expected phase. The timing signal output section 32 outputs a third timing signal that indicates a third comparison timing at which the output signal is compared to the third comparison level corresponding to the expected phase. The timing signal output section 32 generates the first to third timing signals based on the reference phase. For example, the timing signal output section 32 may generate the first to third timing signals by using delay elements to delay the reference signal.

The first level comparison circuit 34-1 compares the output signal to each of the plurality of first comparison levels corresponding to each of the plurality of levels that the output signal can have. The first level comparison circuit 34-1 may include a plurality of first comparators 42-1-1 to 42-1-$n$, where n is an integer greater than 1, that are disposed to correspond respectively to the plurality of levels and that each compare the output signal to the corresponding first comparison level.

The second level comparison circuit 34-2 compares the output signal to each of the plurality of second comparison levels corresponding to each of the plurality of levels that the output signal can have. The second level comparison circuit 34-2 may include a plurality of second comparators 42-2-1 to 42-2-$n$ that are disposed to correspond respectively to the plurality of levels and that each compare the output signal to the corresponding second comparison level.

The third level comparison circuit 34-3 compares the output signal to each of the plurality of third comparison levels corresponding to each of the plurality of levels that the output signal can have. The third level comparison circuit 34-3 may include a plurality of third comparators 42-3-1 to 42-3-$n$ that are disposed to correspond respectively to the plurality of levels and that each compare the output signal to the corresponding third comparison level.

The first acquisition circuit 36-1 acquires a plurality of comparison results from the first level comparison circuit 34-1 at a first comparison timing designated by the first timing signal. The first acquisition circuit 36-1 may include a plurality of first latches 44-1-1 to 44-1-$n$ that correspond to the first comparators 42-1-1 to 42-1-$n$. The first latches 44-1-1 to 44-1-$n$ respectively acquire the comparison results of the corresponding first comparators 42-1-1 to 42-1-$n$ at the timing designated by the first timing signal.

The second acquisition circuit 36-2 acquires a plurality of comparison results from the second level comparison circuit 34-2 at a second comparison timing designated by the second timing signal. The second acquisition circuit 36-2 may include a plurality of second latches 44-2-1 to 44-2-$n$ that correspond to the second comparators 42-2-1 to 42-2-$n$. The second latches 44-2-1 to 44-2-$n$ respectively acquire the comparison results of the corresponding second comparators 42-2-1 to 42-2-$n$ at the timing designated by the second timing signal.

The third acquisition circuit 36-3 acquires a plurality of comparison results from the third level comparison circuit 34-3 at a third comparison timing designated by the third timing signal. The third acquisition circuit 36-3 may include a plurality of third latches 44-3-1 to 44-3-$n$ that correspond to the third comparators 42-3-1 to 42-3-$n$. The third latches 44-3-1 to 44-3-$n$ respectively acquire the comparison results of the corresponding third comparators 42-3-1 to 42-3-$n$ at the timing designated by the third timing signal.

The detecting section 38 receives expected levels and the plurality of comparison results from the first to third acquisition circuits 36-1 to 36-3, compares the level and transition point phases of the output signal to the expected levels and the expected levels, and outputs the comparison results. For example, the detecting section 38 detects that the comparison results obtained by comparing the output signal to the first comparison level corresponding to the expected level, from among the comparison results acquired by the first acquisition circuit 36-1, indicates that the output signal is less than the first comparison level. The detecting section 38 detects that the comparison results obtained by comparing the output signal to the second comparison level corresponding to the expected level, from among the comparison results acquired by the second acquisition circuit 36-2, indicates that the output signal is less than the second comparison level. The detecting section 38 detects that all of the comparison results obtained by comparing the output signal to the third comparison level corresponding to the expected level, from among the comparison results acquired by the third acquisition circuit 36-3, indicate that the output signal is greater than the third comparison level.

The judging section 20 then judges that the output signal matches the expected values on the condition that that output signal is (i) less than or equal to the first comparison level, which is less than the expected level, at the timing designated by the first timing signal, (ii) greater than or equal to the second comparison level, which is less than the expected level, at the timing designated by the second timing signal, and (iii) less than or equal to the third comparison level, which is greater than the expected level, at the timing designated by the third timing signal. The comparing section 18 of the first example having the configuration described above can make a comparison between (i) the expected values and (ii) the level and leading edge phase of the of the amplitude-phase modulated signal output from the device under test 100.

Instead of the first timing signal, the timing signal output section 32 may output a fourth timing signal that indicates a fourth comparison timing at which the output signal is compared to the fourth comparison level corresponding to the expected phase. Instead of the second timing signal, the timing signal output section 32 may output a fourth timing signal that indicates a fifth comparison timing at which the output signal is compared to the fifth comparison level corresponding to the expected phase. Instead of the sixth timing signal, the timing signal output section 32 may output a sixth timing signal that indicates a sixth comparison timing at which the output signal is compared to the sixth comparison level corresponding to the expected phase.

In this case, the first level comparison circuit 34-1 compares the output signal to the fourth comparison level instead of the first comparison level. The second level comparison circuit 34-2 compares the output signal to the fifth comparison level instead of the second comparison level. The third level comparison circuit 34-3 compares the output signal to the sixth comparison level instead of the third comparison level.

Furthermore, in this case, the first acquisition circuit 36-1 acquires a plurality of comparison results from the first level comparison circuit 34-1 at the fourth comparison timing designated by the fourth timing signal. The second acquisition circuit 36-2 acquires a plurality of comparison results from the second level comparison circuit 34-2 at the fifth comparison timing designated by the fifth timing signal. The third acquisition circuit 36-3 acquires a plurality of comparison results from the third level comparison circuit 34-3 at the sixth timing designated by the sixth timing signal.

Also in this case, the judging section 20 then judges that the output signal matches the expected values on the condition that that output signal is (i) less than or equal to the fourth comparison level, which is less than the expected level, at the timing designated by the fourth timing signal, (ii) greater than or equal to the fifth comparison level, which is less than the expected level, at the timing designated by the fifth timing signal, and (iii) less than or equal to the sixth comparison level, which is greater than the expected level, at the timing designated by the sixth timing signal. The comparing section 18 of the first example having the configuration described above can make a comparison between (i) expected values and (ii) the level and trailing edge phase of the of the amplitude-phase modulated signal output from the device under test 100.

Figure 10:
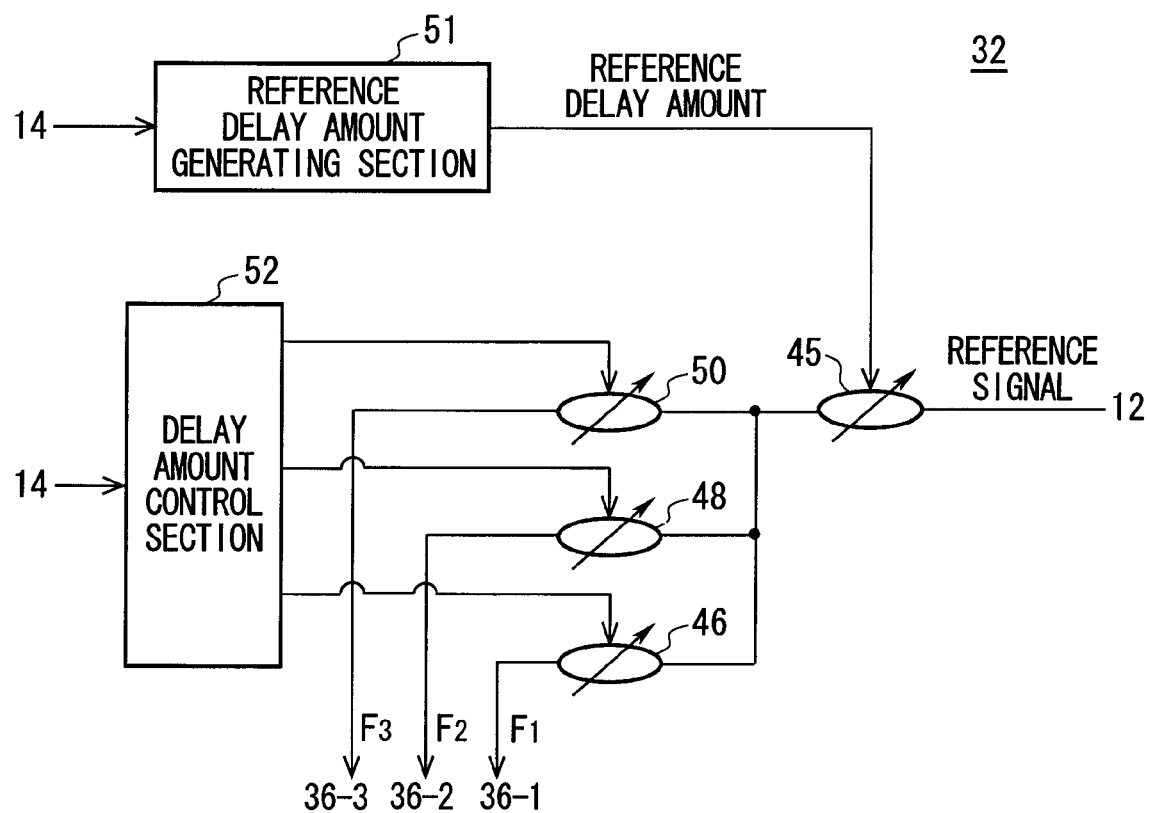
FIG. 10 shows an exemplary configuration of the timing signal output section 32 according to the first example.

FIG. 10 shows an exemplary configuration of the timing signal output section 32 according to the first example. The timing signal output section 32 may include a reference delay section 45, a first variable delay section 46, a second variable delay section 48, a third variable delay section 50, a reference delay amount generating section 51, and a delay amount control section 52.

The reference delay section 45 delays the reference signal output from the reference signal generating section, according to the reference delay amount supplied thereto. The reference delay section 45 may receive the delay amount setting from the outside, and may be a variable delay element that delays the reference signal output from the reference signal generating section 12, for example.

The first variable delay section 46 outputs, as the first timing signal that indicates the comparison timing at which the output signal is compared to the first comparison level, a signal obtained by delaying the reference signal according to the set delay amount. The second variable delay section 48 outputs, as the second timing signal that indicates the comparison timing at which the output signal is compared to the second comparison level, a signal obtained by delaying the reference signal according to the set delay amount. The third variable delay section 50 outputs, as the third timing signal that indicates the comparison timing at which the output signal is compared to the third comparison level, a signal obtained by delaying the reference signal according to the set delay amount. The first variable delay section 46, the second variable delay section 48, and the third variable delay section 50 may each be variable delay elements that can have delay amounts set from the outside and further delay the reference signal output from the reference signal generating section 12 that is already delayed by the reference delay section 45.

The reference delay amount generating section 51 outputs, for each test cycle supplied from the pattern generating section 14, a reference delay amount that indicates a delay amount from a generation timing at which the reference signal is generated by the reference signal generating section 12 to a reference phase in the test cycle. The delay amount control section 52 sets the delay amounts for the first variable delay section 46, the second variable delay section 48, and the third variable delay section 50 according to the expected phase output from the pattern generating section 14. More specifically, the delay amount control section 52 sets the first variable delay section 46 to have a delay amount from the reference phase to the comparison timing for the first comparison level, sets the second variable delay section 48 to have a delay amount from the reference phase to the comparison timing for the second comparison level, and sets the third variable delay section 50 to have a delay amount from the reference phase to the comparison timing for the third comparison level. With the timing signal output section 32 having the above configuration, the timings at which the output signal is compared to the first comparison level, the second comparison level, and the third comparison level can be generated by a simple circuit.

Figure 11:
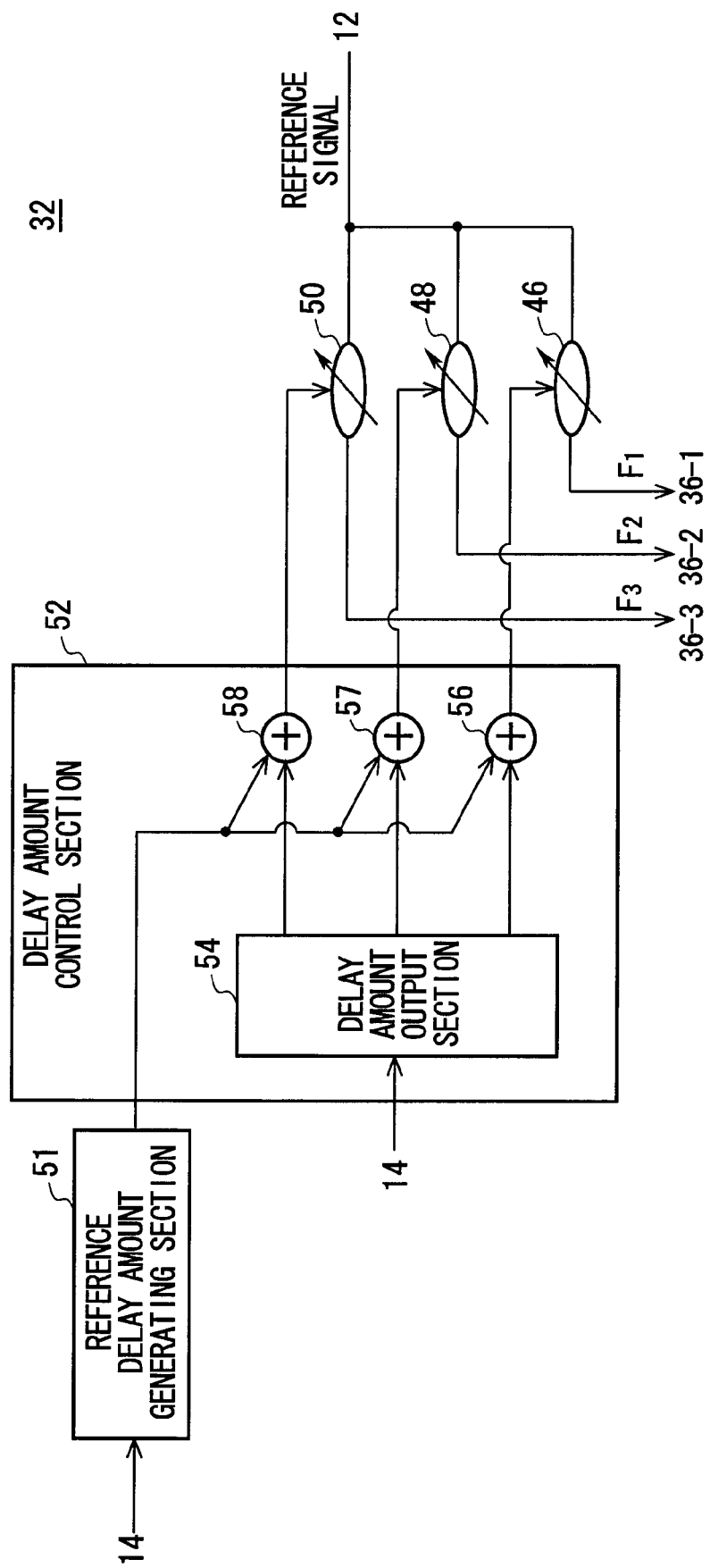
FIG. 11 shows another exemplary configuration of the timing signal output section 32 according to the first example.

FIG. 11 shows another exemplary configuration of the timing signal output section 32 according to the first example. The timing signal output section 32 of FIG. 11 adopts substantially the same function and configuration as the timing signal output section 32 of FIG. 10, and therefore the following describes only differing points.

The timing signal output section 32 may include the first variable delay section 46, the second variable delay section 48, the third variable delay section 50, the reference delay amount generating section 51, and the delay amount control section 52. The first variable delay section 46, the second variable delay section 48, and the third variable delay section 50 delay the reference signal output from the reference signal generating section 12.

The reference delay amount generating section 51 outputs, for each test cycle supplied from the pattern generating section 14, a reference delay amount that indicates a delay amount from a generation timing at which the reference signal is generated by the reference signal generating section 12 to a reference phase in the test cycle. The reference delay amount generating section 51 may output reference delay amounts expressed by digital data.

The delay amount control section 52 includes a delay amount output section 54, a first adding section 56, a second adding section 57, and a third adding section 58. The delay amount output section 54 outputs a delay amount from the reference phase to the comparison timing of the first comparison level, a delay amount from the reference phase to the comparison timing of the second comparison level, and a delay amount from the reference phase to the comparison timing of the third comparison level. The delay amount control section 52 may output delay amounts expressed by digital data.

The first adding section 56 adds together (i) the delay amount from the reference phase to the comparison timing of the first comparison level, which is output by the delay amount output section 54, and (ii) a reference delay amount output by the reference delay amount generating section 51.

The first adding section 56 sets the first variable delay section 46 to have the delay amount obtained as a result of this addition.

The second adding section 57 adds together (i) the delay amount from the reference phase to the comparison timing of the second comparison level, which is output by the delay amount output section 54, and (ii) the reference delay amount output by the reference delay amount generating section 51. The first adding section 56 sets the second variable delay section 48 to have the delay amount obtained as a result of this addition.

The third adding section 58 adds together (i) the delay amount from the reference phase to the comparison timing of the third comparison level, which is output by the delay amount output section 54, and (ii) the reference delay amount output by the reference delay amount generating section 51. The first adding section 56 sets the third variable delay section 50 to have the delay amount obtained as a result of this addition. With the timing signal output section 32 having the above configuration, the timings at which the output signal is compared to the first comparison level, the second comparison level, and the third comparison level can be generated by an even simpler circuit.

Figure 12:
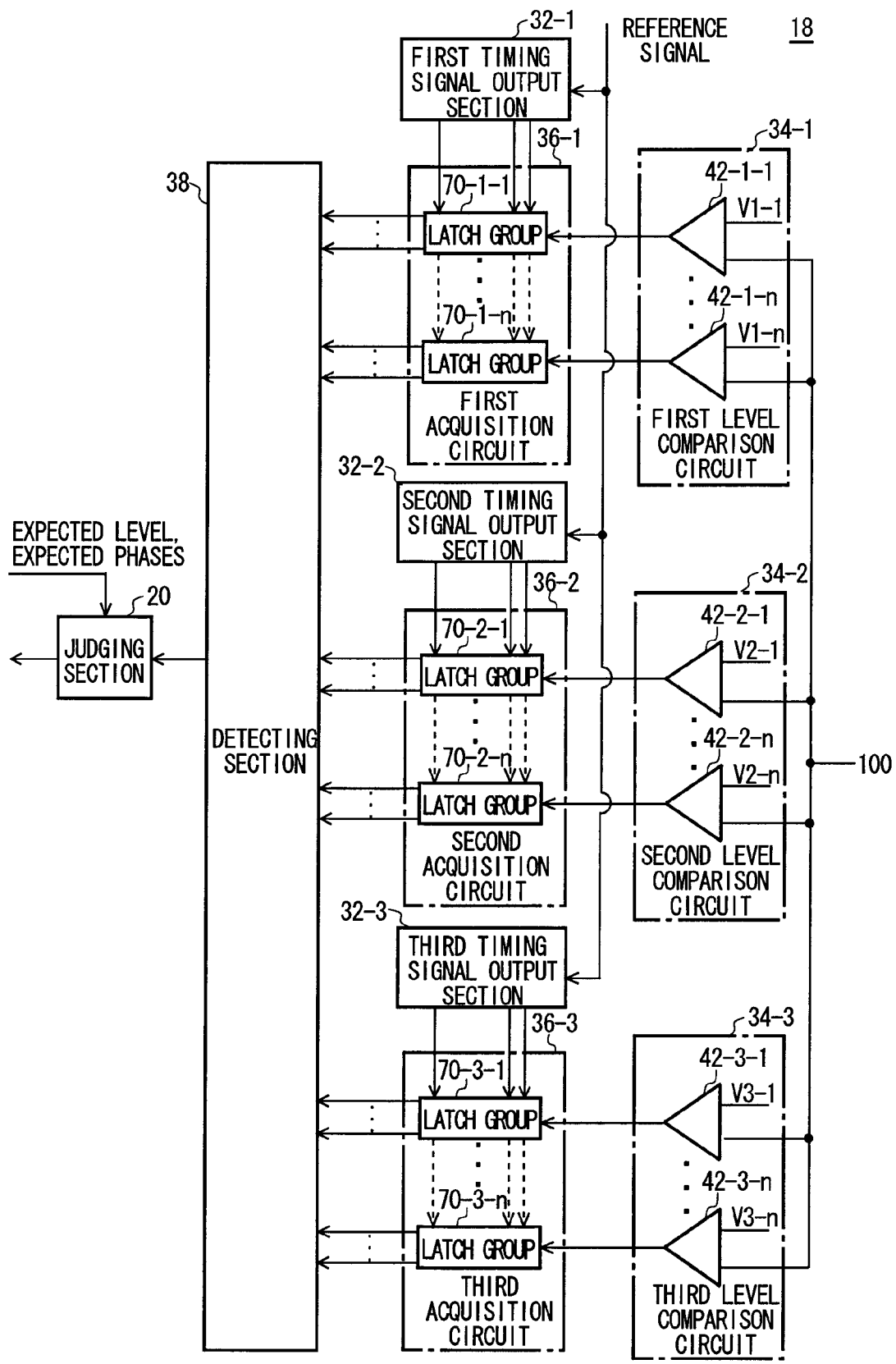
FIG. 12 shows a configuration of the comparing section 18 according to a second example of the present embodiment along with the judging section 20.
Figure 13:
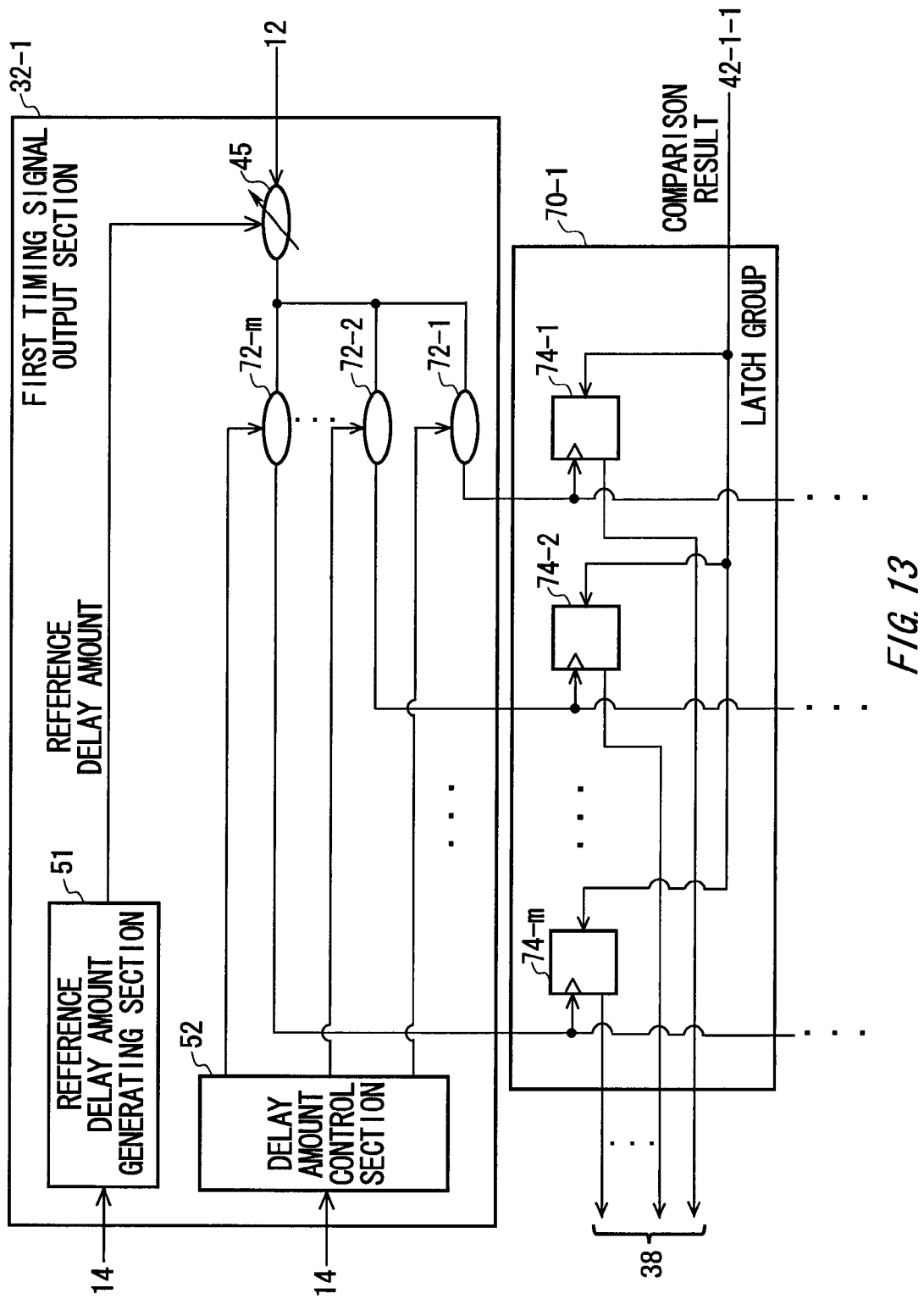
FIG. 13 shows exemplary configurations of the first timing signal output section 32-1 and the latch group 70 according to the second example.

FIG. 12 shows a configuration of the comparing section 18 according to a second example of the present embodiment along with the judging section 20. FIG. 13 shows exemplary configurations of the first timing signal output section 32-1 and the latch group 70 according to the second example.

The comparing section 18 of the present embodiment adopts the same function and configuration as the comparing section 18 shown in FIG. 9, and so components having substantially the same function and configuration as components shown in FIG. 9 are given the same reference numerals and only differing points are described. In the present embodiment, the pattern generating section 14 supplies the expected level and the expected phases to the judging section 20 instead of to the comparing section 18. The comparing section 18 includes first to third timing signal output sections 32-1 to 32-3, the first to third level comparison circuits 34-1 to 34-3, the first to third acquisition circuits 36-1 to 36-3, and the detecting section 38.

The first timing signal output section 32-1 outputs a plurality of first timing signals that indicate comparison timings at which the output signal is compared to the first comparison level, for each expected phase that the output signal can have. The first timing signal output signal 32-1 may include the reference delay amount generating section 51, the delay amount control section 52, the reference delay section 45, and a plurality of delay elements 72-1 to 72-m, as shown in FIG. 13.

The delay elements 72-1 to 72-m are provided to correspond to the plurality of phases that the output signal can have. The delay elements 72-1 to 72-m may further delay, by the set delay amount, the reference signal that is already delayed by the reference delay section 45. The delay elements 72-1 to 72-m each output the delayed reference signal as the first timing signal that indicates the timing at which the output signal is compared to the first comparison level at the corresponding phase of the output signal.

The delay amount control section 52 sets the delay amounts for the delay elements 72-1 to 72-m. The delay amount control section 52 sets the delay amounts according to the test cycle and the like output from the pattern generating section 14. More specifically, the delay amount control section 52 sets each of the delay elements 72-1 to 72-m to have delay amounts from the reference phase to the comparison timing of the first comparison level at the corresponding phase.

The second timing signal output section 32-2 outputs a plurality of second timing signals that indicate comparison timings at which the output signal is compared to the second comparison level, for each expected phase that the output signal can have. The second timing signal output section 32-2 may have the same configuration as the first timing signal output section 32-1 shown in FIG. 13.

The third timing signal output section 32-3 outputs a plurality of third timing signals that indicate comparison timings at which the output signal is compared to the third comparison level, for each expected phase that the output signal can have. The third timing signal output section 32-3 may have the same configuration as the first timing signal output section 32-1 shown in FIG. 13.

The first acquisition circuit 36-1 includes a plurality of latch groups 70-1-1 to 70-1-n that correspond to the comparators 42-1-1 to 42-1-n within the first level comparison circuit 34-1. The latch groups 70-1-1 to 70-1-n respectively acquire the comparison results of the corresponding comparators 42-1 at each of the timings designated by the first timing signal output from the first timing signal output section 32-1.

As shown in FIG. 13, each of the latch groups 70-1-1 to 70-1-n may include a plurality of latches 74-1 to 74-m provided to correspond to the phases that the output signal can have. The latches 74-1 to 74-m respectively acquire the comparison results of the corresponding comparators 42-1 at each of the timings designated by the first timing signal from among the plurality of first timing signals output from the first timing signal output section 32-1. Each of the latches 74-1 to 74-m outputs the acquired result to the detecting section 38.

The second acquisition circuit 36-2 includes a plurality of latch groups 70-2-1 to 70-2-n that correspond to the comparators 42-2-1 to 42-2-n within the second level comparison circuit 34-2. The latch groups 70-2-1 to 70-2-n respectively acquire the comparison results of the corresponding comparators 42-2 at each of the timings designated by the second timing signal output from the second timing signal output section 32-2. The latch groups 70-2-1 to 70-2-n may have the same configuration as the latch groups 70-1 shown in FIG. 13.

The third acquisition circuit 36-3 includes a plurality of latch groups 70-3-1 to 70-3-n that correspond to the comparators 42-3-1 to 42-3-n within the third level comparison circuit 34-3. The latch groups 70-3-1 to 70-3-n respectively acquire the comparison results of the corresponding comparators 42-3 at each of the timings designated by the third timing signal output from the third timing signal output section 32-3. The latch groups 70-3-1 to 70-3-n may have the same configuration as the latch groups 70-1 shown in FIG. 13.

The detecting section 38 detects the level and the transition point phase for which the output signal is (i) less than or equal to the first comparison level at the first comparison timing and (ii) less than or equal to the second comparison level and greater than or equal to the third comparison level at the second comparison timing, based on the plurality of level comparison results acquired by the first acquisition circuit 36-1, the second acquisition circuit 36-2, and the third acquisition circuit 36-3. In other words, the detecting section 38 detects the level of the received output signal and the phase of the transition point of the received output signal.

The judging section 20 then judges whether the level and transition point phase detected by the comparing section 18 match the expected level and the expected phase output from the pattern generating section 14. The comparing section 18 of the second example having the configuration described above can detect the level and the leading edge phase of the received output signal, and can make a comparison between (i) the expected values and (ii) the detected level and leading edge phase.

Figure 14:
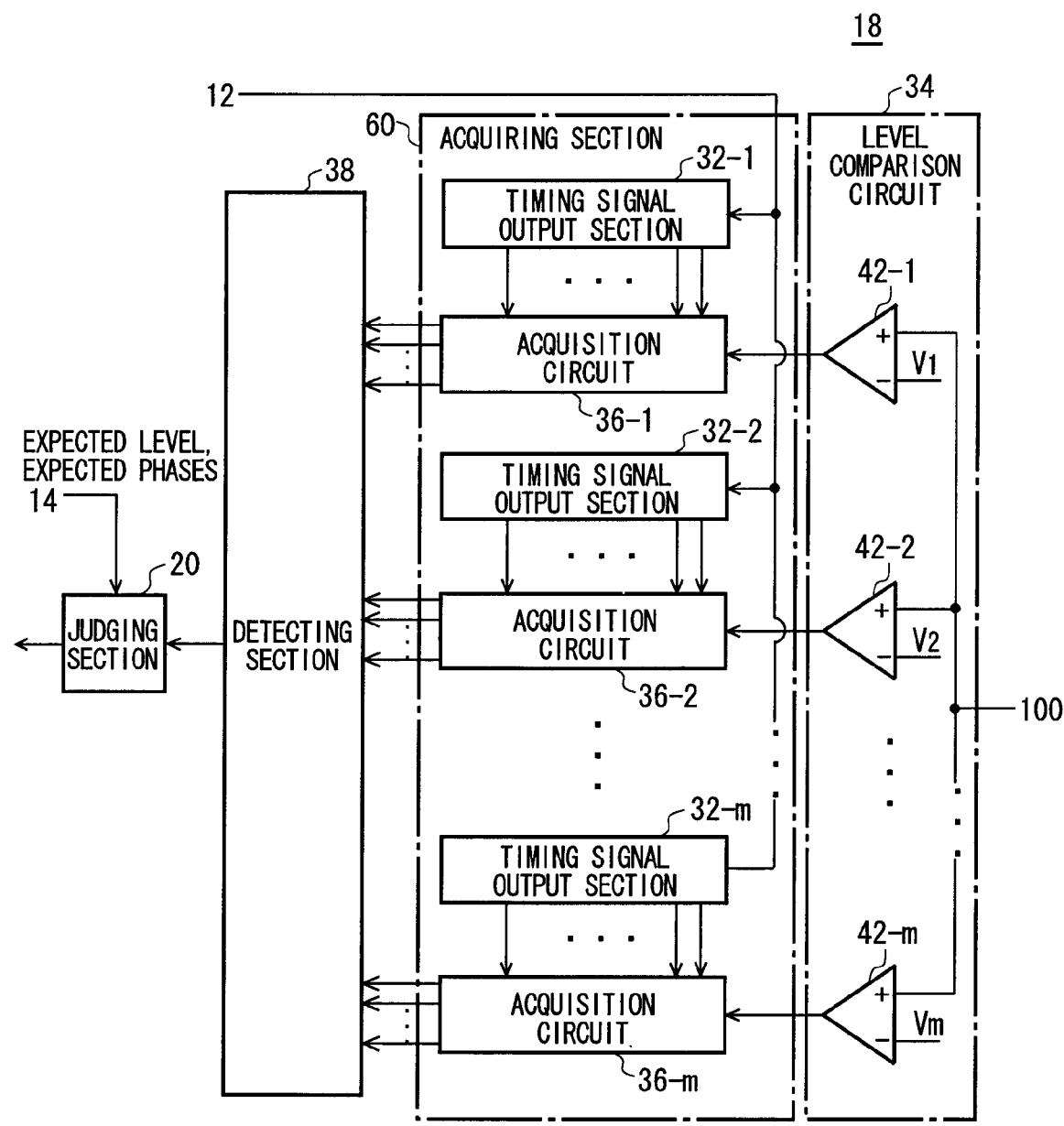
FIG. 14 shows a configuration of the comparing section 18 according to a third example of the present embodiment along with the judging section 20.
Figure 15:
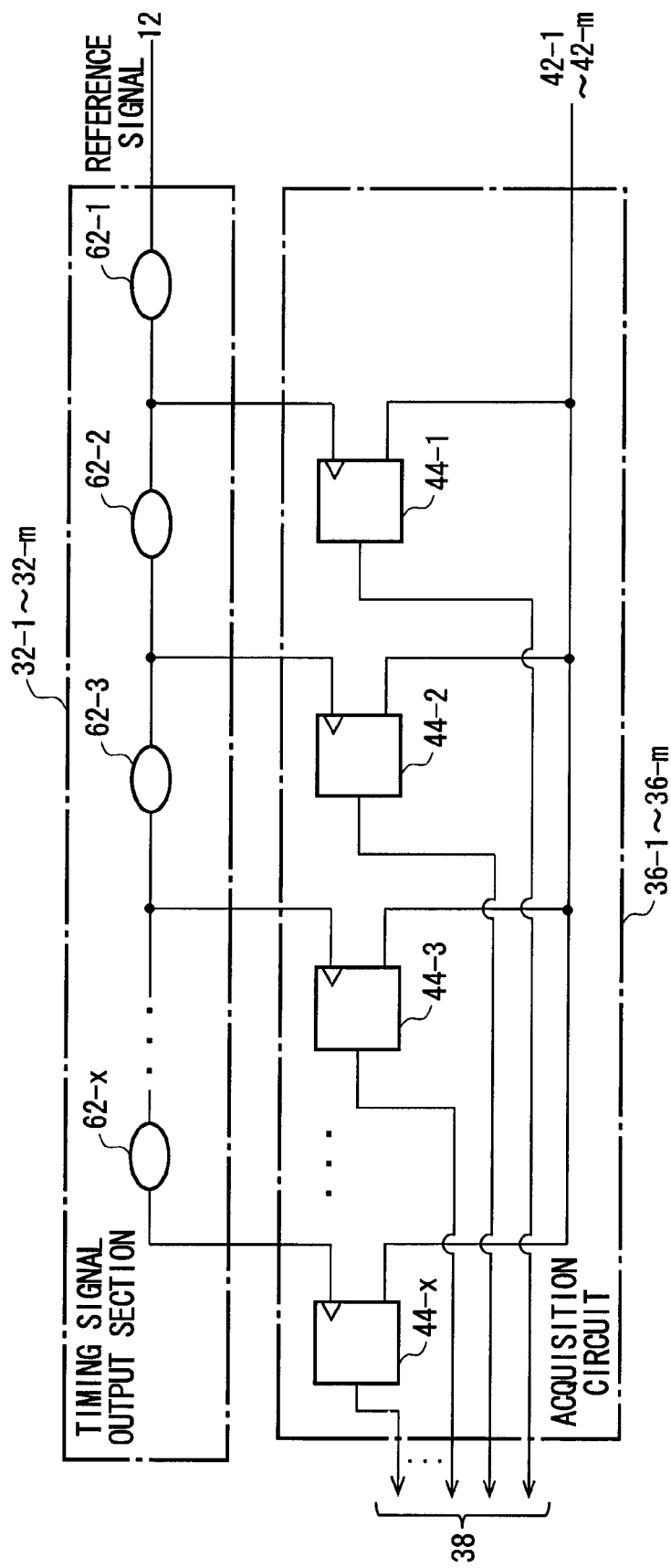
FIG. 15 shows a detailed configuration of a timing signal output section 32 and an acquisition circuit 36 shown in FIG. 14.

FIG. 14 shows a configuration of the comparing section 18 according to a third example of the present embodiment, along with the judging section 20. FIG. 15 shows a detailed configuration of a timing signal output section 32 and an acquisition circuit 36 shown in FIG. 14.

The comparing section 18 of the present embodiment adopts the same function and configuration as the comparing section 18 shown in FIG. 9, and so components having substantially the same function and configuration as components shown in FIG. 9 are given the same reference numerals and only differing points are described. In the present embodiment, the pattern generating section 14 supplies the expected level and the expected phase to the judging section 20 instead of to the comparing section 18.

First comparison levels and third comparison levels corresponding to the same level but different phases can be set in the comparing section 18 to have the same level. Furthermore, second comparison levels corresponding to the same level but different phases can be set in the comparing section 18 to have the same level.

The comparing section 18 includes the level comparison circuit 34, an acquiring section 60, and the detecting section 38. The level comparison circuit 34 compares the output signal output by the device under test 100 in response to the test signal to each of the first comparison levels that are less than the corresponding level among the plurality of levels that the output signal can have and the second comparison levels that are greater than the corresponding level among the plurality of levels that the output signal can have. The level comparison circuit 34 outputs the level comparison results between the output signal and each of the plurality of first comparison levels and second comparison levels corresponding to the levels that the output signal can have.

The level comparison circuit 34 may include a plurality of comparators 42-1 to 42-$m$ (where m is an integer greater than 1) provided to correspond to the first comparison levels and the second comparison levels for each level that the output signal can have. The comparators 42-1 to 42-$m$ each compare the output signal to the corresponding first comparison level or second comparison level.

The acquiring section 60 acquires the level comparison results from the level comparison circuit 34 at each of the first comparison timing, which is before the corresponding phase among the phases that the output signal can have, and the second comparison timing, which is after the corresponding phase among the phases that the output signal can have. The acquiring section 60 may include a plurality of acquisition circuits 36-1 to 36-$m$ and a plurality of timing signal output sections 32-1 to 32-$m$.

The acquisition circuits 36-1 to 36-$m$ are provided to correspond to the comparators 42-1 to 42-$m$. The acquisition circuits 36-1 to 36-$m$ include latches 44-1 to 44-$x$ (where x is an integer greater than 1) that each acquire the level comparison results from the corresponding comparators 42-1 to 42-$m$.

The timing signal output sections 32-1 to 32-$m$ are provided to correspond to the acquisition circuits 36-1 to 36-$m$. The timing signal output sections 32-1 to 32-$m$ include delay elements 62-1 to 62-$x$ that sequentially delay the reference signal.

The delay elements 62-1 to 62-$x$ of each timing signal output section 32 are connected serially to sequentially delay the reference signal by predetermined delay amounts. The delay elements 62-1 to 62-$x$ of each timing signal output section 32 output a plurality of timing signals that indicate a first comparison timing and a second comparison timing for each expected phase that the output signal can have.

Furthermore, the latches 44-1 to 44-$x$ in each acquisition circuit 36 acquire the level comparison results from the corresponding comparators 42 at the timing designated by the corresponding timing signal. Each acquisition circuit 36 outputs, to the detecting section 38, the level comparison results acquired by the latches 44-1 to 44-$x$.

The detecting section 38 detects the level and the transition point phase for which the output signal is (i) less than or equal to the first comparison level at the first comparison timing and (ii) less than or equal to the second comparison level and greater than or equal to the first comparison level at the second comparison timing, based on the plurality of level comparison results acquired by the acquiring section 60. In other words, the detecting section 38 detects the level of the received output signal and the phase of the transition points of the received output signal.

The detecting section 38 may detect that the level and transition point phase of the output signal from the device under test 100 are unknown values on the condition that the output signal is not within a range between the first comparison level and the second comparison level for each of the levels that that the output signal can have, at the first comparison timing and the second comparison timing for each of the phases that the output signal can have. As a result, the detecting section 38 can detect that the value modulated by the output signal is unknown if the level of the output signal does not correspond to any of the plurality of levels or if the transition point phase of the output signal does not correspond to any of the plurality of phases.

The judging section 20 then judges whether the level and transition point phase detected by the comparing section 18 match the expected level and the expected phase output from the pattern generating section 14. The comparing section 18 of the third example having the configuration described above can detect the level and the leading edge phase of the received output signal, and can make a comparison between (i) the expected values and (ii) the detected level and leading edge phase.

The first timing signal output section 32-1 and the second timing signal output section 32-2, from among the timing signal output sections 32-1 to 32-$m$, may include delay elements 62-1 to 62-$x$ having different delay amounts for at least the first stages thereof. The timing signal output sections 32-1 to 32-$m$ may be set such that the delay amounts of the first stages in the delay elements 62-1 to 62-$x$ are greater when the comparison levels of the corresponding comparators 42 are greater. As a result, the timing signal output sections 32-1 to 32-$m$ can acquire accurate comparison results even when the waveform is not sharp due to slow rising edges or falling edges at the transition points.

Instead of the timing signal output sections 32-1 to 32-$m$, the acquiring section 60 may include a single timing signal output section 32 that is shared by the plurality of acquisition circuits 36-1 to 36-$m$. The single shared timing signal output section 32 outputs, to the acquisition circuits 36-1 to 36-$m$, a plurality of timing signals that indicate a first comparison timing and a second comparison timing for each expected phase that the output signal can have.

Instead of the above configuration, the level comparison circuit 34 may output level comparison results obtained by comparing the output signal output by the device under test 100 in response to the test signal to each of the fourth comparison levels that are less than the corresponding level among the plurality of levels that the output signal can have and the fifth comparison levels that are greater than the corresponding level among the plurality of levels that the output signal can have. In this case, instead of acquiring the comparison results at the first comparison timing and the second comparison timing, the acquiring section 60 acquires the level comparison results from the level comparison circuit 34 at each of the fifth comparison timing, which is before the corresponding phase among the phases that the output signal can have, and the fourth comparison timing, which is after the corresponding phase among the phases that the output signal can have.

Furthermore, in this case, the detecting section 38 detects the level and the transition point phase for which the output signal is (i) less than or equal to the fourth comparison level at the fourth comparison timing and (ii) less than or equal to the fifth comparison level and greater than or equal to the fourth comparison level at the fifth comparison timing, based on the plurality of level comparison results acquired by the acquiring section 60. The comparing section 18 of the third example having the configuration described above can detect the level and the trailing edge phase of the received output signal, and can make a comparison between (i) the expected values and (ii) the detected level and trailing edge phase.

The test apparatus 10 may be a test circuit provided in the same electronic device as the circuit under test. This test circuit can be realized as a BIST circuit or the like of the electronic device, which performs a diagnosis of the electronic device by testing the circuit under test. As a result, the test circuit can check whether the circuit under test can perform normal operation that is the objective of the electronic device.

The test apparatus 10 may be a test circuit provided on the same board or in the same apparatus as the circuit under test. In the same manner as the above test circuit, this test circuit can check whether the circuit under test can perform normal operation that is the objective of the electronic device.

Figure 16:
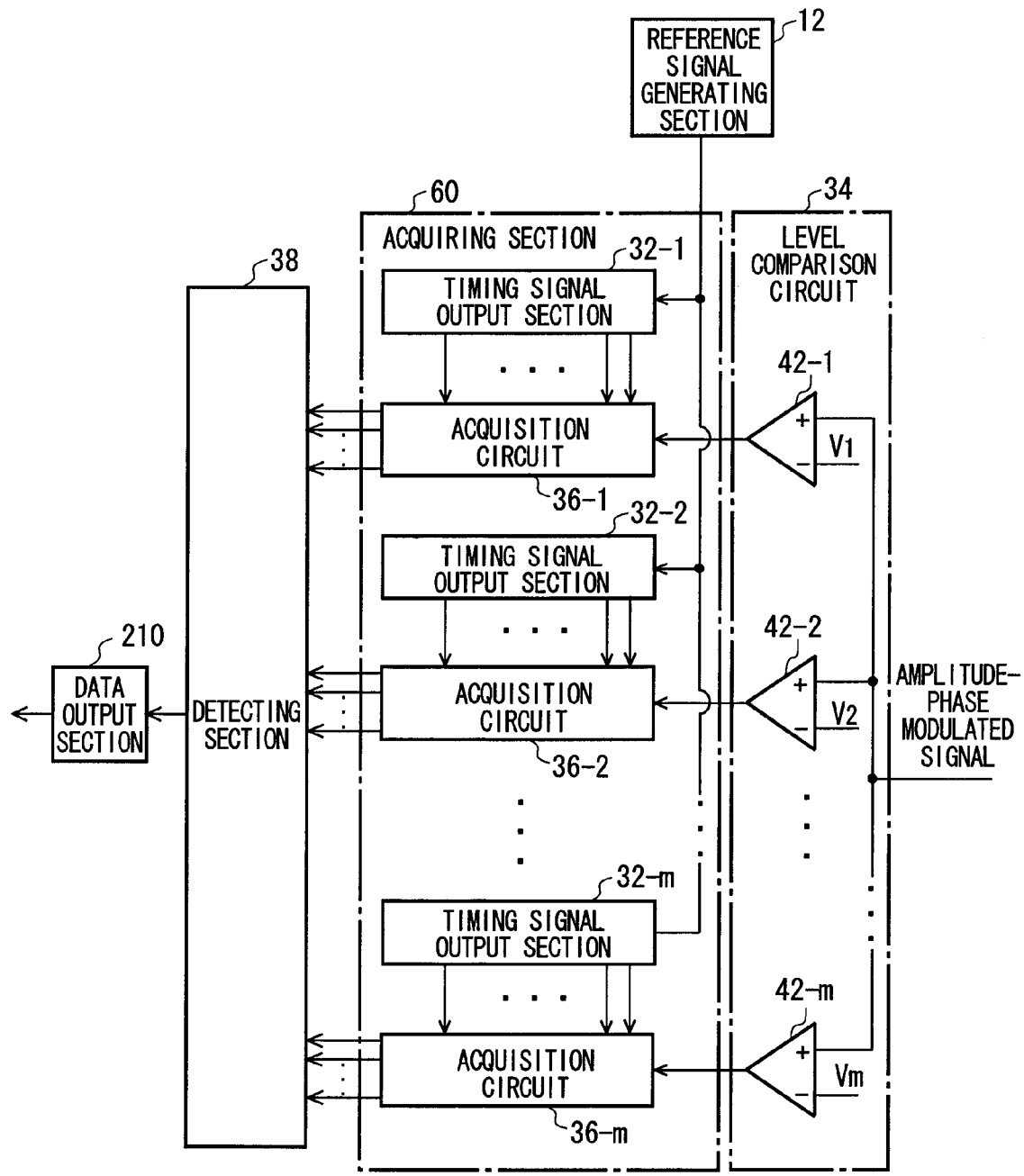
FIG. 16 shows a demodulation apparatus 200 according to the present embodiment.

FIG. 16 shows a demodulation apparatus 200 according to the present embodiment. In the demodulation apparatus 200 of the present embodiment, components that adopt the same function and configuration as components in FIGS. 1 to 15 are given the same reference numerals, and the following describes only differing points.

The demodulation apparatus 200 demodulates an amplitude-phase modulated signal, and may be an electronic device, a module, a circuit in an electronic device, or the like. The demodulation apparatus 200 may be implemented in a semiconductor device.

The demodulation apparatus 200 includes the reference signal generating section 12, the level comparison circuit 34, the acquiring section 60, the detecting section 38, and a data output section 210. The reference signal generating section 12 outputs a clock signal of the output signal as a reference signal. The reference signal generating section 12 may generate the clock signal from the amplitude-phase modulated signal using a PLL or the like.

The level comparison circuit 34 receives the amplitude-phase modulated signal. The level comparison circuit 34 adopts substantially the same function and configuration as the level comparison circuit 34 shown in FIG. 14. The acquiring section 60 and the detecting section 38 adopt substantially the same function and configuration as the acquiring section 60 and the detecting section 38 shown in FIG. 14.

The data output section 210 outputs data corresponding to the level and transition point phase detected by the detecting section 38. In other words, the data output section 210 outputs transmission data obtained by demodulating the amplitude-phase modulated signal. The demodulation apparatus 200 having the configuration described above can detect the level and phase of the received amplitude-phase modulated signal and output transmission data corresponding to the detected level and phase.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test apparatus for testing a device under test that outputs, as an output signal, an amplitude-phase modulated signal having a level and a transition point phase selected from among a plurality of levels and a plurality of phases according to transmission data, the test apparatus comprising:
   a test signal output section that outputs a test signal to the device under test;
   a pattern generating section that generates an expected level, which is an expected value for a level of the output signal to be output from the device under test in response to the test signal, and an expected phase, which is an expected value for the transition point phase of the output signal;
   a comparing section that compares the output signal to a first comparison level, which is less than the expected level, before the expected phase, and compares the output signal to a second comparison level, which is greater than the expected level, and to a third comparison level, which is less than the expected level, after the expected phase; and
   a judging section that judges that the output signal matches the expected values on a condition that (i) the output signal is less than or equal to the first comparison level before the expected phase and (ii) the output signal is less than or equal to the second comparison level and greater than or equal to the third comparison level after the expected phase.

2. The test apparatus according to claim 1, wherein the comparing section compares the output signal to the third comparison level, which is substantially equal to the first comparison level, after the expected phase.

3. The test apparatus according to claim 2, wherein the comparing section compares the output signal to the second comparison level and the third comparison level at substantially the same timing after the expected phase.

4. The test apparatus according to claim 1, wherein the comparing section compares the output signal to the third comparison level, which is greater than the first comparison level, after the expected phase.

5. The test apparatus according to claim 4, wherein the comparing section compares the output signal to the second comparison level after comparing the output signal to the third comparison level.

6. The test apparatus according to claim 1, further comprising
   a reference signal generating section that generates a reference signal having a period corresponding to a test cycle, wherein
   the comparing section includes:
      a first variable delay section that outputs, as a first timing signal indicating a timing at which the output signal is compared to the first comparison level, a signal obtained by delaying the reference signal by a set delay amount;

a second variable delay section that outputs, as a second timing signal indicating a timing at which the output signal is compared to the second comparison level, a signal obtained by delaying the reference signal by a set delay amount;
a third variable delay section that outputs, as a third timing signal indicating a timing at which the output signal is compared to the third comparison level, a signal obtained by delaying the reference signal by a set delay amount; and
a delay amount control section that sets the delay amounts of the first variable delay section, the second variable delay section, and the third variable delay section according to the expected phase.

7. The test apparatus according to claim 6, wherein the comparing section further includes:
    a reference delay amount generating section that, for each test cycle, outputs a reference delay amount indicating a delay amount that is from a generation timing of the reference signal by the reference signal generating section to the reference phase; and
    a reference delay section that delays the reference signal output from the reference signal generating section according to the reference delay amount,
the first variable delay section, the second variable delay section, and the third variable delay section delay the reference signal that has been delayed by the reference delay section, and
the delay amount control section sets the first variable delay section to have a delay amount that is from the reference phase to the comparison timing of the first comparison level, sets the second variable delay section to have a delay amount that is from the reference phase to the comparison timing of the second comparison level, and sets the third variable delay section to have a delay amount that is from the reference phase to the comparison timing of the third comparison level.

8. The test apparatus according to claim 7, wherein the comparing section further includes:
    a plurality of first comparators that are provided to correspond to a plurality of levels that the output signal can have, and that each compare the output signal to the corresponding first comparison level;
    a plurality of first latches that are provided to correspond to the plurality of first comparators, and that each acquire a comparison result from the corresponding first comparator at the timing designated by the first timing signal;
    a plurality of second comparators that are provided to correspond to the plurality of levels that the output signal can have, and that each compare the output signal to the corresponding second comparison level;
    a plurality of second latches that are provided to correspond to the plurality of second comparators, and that each acquire a comparison result from the corresponding second comparator at the timing designated by the second timing signal;
    a plurality of third comparators that are provided to correspond to the plurality of levels that the output signal can have, and that each compare the output signal to the corresponding third comparison level; and
    a plurality of third latches that are provided to correspond to the plurality of third comparators, and that each a acquire comparison result from the corresponding third comparator at the timing designated by the third timing signal.

9. The test apparatus according to claim 7, comprising:
    a delay amount output section that outputs a delay amount that is from the reference phase to the comparison timing of the first comparison level, a delay amount that is from the reference phase to the comparison timing of the second comparison level, and a delay amount that is from the reference phase to the comparison timing of the third comparison level;
    a first adding section that sets the first variable delay section to have a delay amount obtained by adding together the reference delay amount and the delay amount that is from the reference phase to the comparison timing of the first comparison level;
    a second adding section that sets the second variable delay section to have a delay amount obtained by adding together the reference delay amount and the delay amount that is from the reference phase to the comparison timing of the second comparison level; and
    a third adding section that sets the third variable delay section to have a delay amount obtained by adding together the reference delay amount and the delay amount that is from the reference phase to the comparison timing of the third comparison level.

10. The test apparatus according to claim 9, wherein the comparing section further includes:
    a plurality of first comparators that are provided to correspond to a plurality of levels that the output signal can have, and that each compare the output signal to the corresponding first comparison level;
    a plurality of first latches that are provided to correspond to the plurality of first comparators, and that each acquire a comparison result from the corresponding first comparator at the timing designated by the first timing signal;
    a plurality of second comparators that are provided to correspond to the plurality of levels that the output signal can have, and that each compare the output signal to the corresponding second comparison level;
    a plurality of second latches that are provided to correspond to the plurality of second comparators, and that each acquire a comparison result from the corresponding second comparator at the timing designated by the second timing signal;
    a plurality of third comparators that are provided to correspond to the plurality of levels that the output signal can have, and that each compare the output signal to the corresponding third comparison level; and
    a plurality of third latches that are provided to correspond to the plurality of third comparators, and that each acquire a comparison result from the corresponding third comparator at the timing designated by the third timing signal.

11. The test apparatus according to claim 1, further comprising
    a reference signal generating section that generates a reference signal having a period corresponding to a test cycle, wherein
the comparing section further includes:
    a first timing signal output section that delays the reference signal using delay elements to output a plurality of first timing signals respectively indicating timings at which the output signal is compared to the first comparison level when each of the phases that the output signal can have is set as the expected phase;
    a second timing signal output section that delays the reference signal using delay elements to output a plurality of second timing signals respectively indicating timings at which the output signal is compared to the second comparison level when each of the phases that the output signal can have is set as the expected phase;

a third timing signal output section that delays the reference signal using delay elements to output a plurality of third timing signals respectively indicating timings at which the output signal is compared to the third comparison level when each of the phases that the output signal can have is set as the expected phase; and a detecting section that detects a level and a transition point phase that cause the output signal to be less than or equal to the first comparison level at the first comparison timing and to be less than or equal to the second comparison level and greater than or equal to the third comparison level at the second comparison timing, and the judging section judges whether the level and the transition point phase detected by the detecting section match the expected level and the expected phase.

12. The test apparatus according to claim 11, wherein the comparing section further includes:

a plurality of first comparators that are provided to correspond to a plurality of levels that the output signal can have, and that each compare the output signal to the corresponding first comparison level;

a first acquisition circuit having a plurality of latch groups that are provided to correspond to the plurality of first comparators and that each acquire comparison results from the corresponding first comparator at the timings designated by the first timing signals;

a plurality of second comparators that are provided to correspond to the plurality of levels that the output signal can have, and that each compare the output signal to the corresponding second comparison level;

a second acquisition circuit having a plurality of latch groups that are provided to correspond to the plurality of second comparators and that each acquire comparison results from the corresponding second comparator at the timings designated by the second timing signals;

a plurality of third comparators that are provided to correspond to the plurality of levels that the output signal can have, and that each compare the output signal to the corresponding third comparison level; and a third acquisition circuit having a plurality of latch groups that are provided to correspond to the plurality of third comparators and that each acquire comparison results from the corresponding third comparator at the timings designated by the third timing signals.

13. The test apparatus according to claim 1, wherein the comparing section includes:

a level comparison circuit that outputs a plurality of level comparison results obtained by comparing, for each of the levels that the output signal output by the device under test in response to the test signal can have, (i) the output signal to (ii) each of the first comparison level, which is less than the corresponding level, and the second comparison level, which is greater than the corresponding level;

an acquiring section that acquires the level comparison results obtained by the level comparison circuit, for each of the phases that the output signal can have, at each of the first comparison timing, which is before the corresponding phase, and the second comparison timing, which is after the corresponding phase; an a detecting section that detects a level and a transition point phase that cause the output signal to be less than or equal to the first comparison level at the first comparison timing and to be less than or equal to the second comparison level and greater than or equal to the first comparison level at the second comparison timing, based on the level comparison results acquired by the acquiring section, and the judging section judges whether the level and the transition point phase detected by the detecting section match the expected level and the expected phase.

14. The test apparatus according to claim 13, further comprising a reference signal generating section that generates a reference signal having a period corresponding to a test cycle, wherein the level comparison circuit includes a plurality of comparators that are provided to correspond to the first comparison level and the second comparison level for each level that the output signal can have, and that each compare the output signal to the corresponding first comparison level or second comparison level, the acquiring section includes:

a plurality of acquisition circuits having a plurality of latches that are provided to correspond one-to-one with the plurality of comparators and that each acquire level comparison results from the corresponding comparator; and a plurality of timing signal output sections having delay elements that are provided to correspond one-to-one with the plurality of acquisition circuits and that sequentially delay the reference signal, each delay element in the timing signal output sections outputs a plurality of timing signals indicating the first comparison timing and the second comparison timing for each of the plurality of phases that the output signal can have, and each latch in the acquisition circuits acquires the level comparison results from the corresponding comparator at a timing designated by the corresponding timing signal.

15. The test apparatus according to claim 14, wherein the first timing signal output section and the second timing signal output section, from among the plurality of timing signal output sections, have different delay amounts from each other in at least a first-stage delay element from among the plurality of delay elements.

16. The test apparatus according to claim 13, wherein the detecting section detects that the level and the transition point phase of the output signal are unknown values on a condition that the output signal from the device under test is not within a range between the first comparison level and the second comparison level, inclusive, for each of the levels that that the output signal can have, at the first comparison timing and the second comparison timing for each of the phases that the output signal can have.

17. A test apparatus for testing a device under test that outputs, as an output signal, an amplitude-phase modulated signal having a level and a transition point phase selected from among a plurality of levels and a plurality of phases according to transmission data, the test apparatus comprising:

a test signal output section that outputs a test signal to the device under test;

a pattern generating section that generates an expected level, which is an expected value for a level of the output signal to be output from the device under test in response to the test signal, and an expected phase, which is an expected value for the transition point phase of the output signal;

a comparing section that compares the output signal to a first comparison level, which is greater than the expected level, and to a second comparison level, which is less than the expected level, before the expected phase, and compares the output signal to a third comparison level, which is less than the expected level, after the expected phase; and a judging section that judges that the output signal matches the expected values on a condition that (i) the output signal is less than or equal to the first comparison level and greater than or equal to the second comparison level before the expected phase and (ii) the output signal is less than or equal to the third comparison level after the expected phase.

18. A demodulation apparatus that demodulates an amplitude-phase modulated signal having a level and a transition point phase selected from among a plurality of levels and phases according to transmission data, the demodulation apparatus comprising:

a level comparison circuit that outputs a plurality of level comparison results obtained by comparing, for each of the levels that the received amplitude-phase modulated signal can have, (i) the amplitude-phase modulated signal to (ii) each of a first comparison level, which is less than the corresponding level, and a second comparison level, which is greater than the corresponding level;

an acquiring section that acquires the level comparison results obtained by the level comparison circuit, for each of the phases that the amplitude-phase modulated signal can have, at each of a first comparison timing, which is before the corresponding phase, and a second comparison timing, which is after the corresponding phase;

a detecting section that detects a level and a transition point phase that cause the amplitude-phase modulated signal to be less than or equal to the first comparison level at the first comparison timing and to be less than or equal to the second comparison level and greater than or equal to the first comparison level at the second comparison timing, based on the level comparison results acquired by the acquiring section; and a data output section that outputs data corresponding to the level and transition point detected by the detecting section.

19. A demodulation apparatus that demodulates an amplitude-phase modulated signal having a level and a transition point phase selected from among a plurality of levels and phases according to transmission data, the demodulation apparatus comprising:

a level comparison circuit that outputs a plurality of level comparison results obtained by comparing, for each of the levels that the received amplitude-phase modulated signal can have, (i) the amplitude-phase modulated signal to (ii) each of a first comparison level, which is less than the corresponding level, and a second comparison level, which is greater than the corresponding level;

an acquiring section that acquires the level comparison results obtained by the level comparison circuit, for each of the phases that the amplitude-phase modulated signal can have, at each of a first comparison timing, which is after the corresponding phase, and a second comparison timing, which is before the corresponding phase;

a detecting section that detects a level and a transition point phase that cause the amplitude-phase modulated signal to be less than or equal to the first comparison level at the first comparison timing and to be less than or equal to the second comparison level and greater than or equal to the first comparison level at the second comparison timing, based on the level comparison results acquired by the acquiring section; and a data output section that outputs data corresponding to the level and transition point detected by the detecting section.

20. A test method for testing a device under test that outputs, as an output signal, an amplitude-phase modulated signal having a level and a transition point phase selected from among a plurality of levels and a plurality of phases according to transmission data, the test method comprising:

outputting a test signal to the device under test;

generating an expected level, which is an expected value for a level of the output signal to be output from the device under test in response to the test signal, and an expected phase, which is an expected value for the transition point phase of the output signal;

comparing the output signal to a first comparison level, which is less than the expected level, before the expected phase, and compares the output signal to a second comparison level, which is greater than the expected level, and to a third comparison level, which is less than the expected level, after the expected phase; an judging that the output signal matches the expected values on a condition that (i) the output signal is less than or equal to the first comparison level before the expected phase and (ii) the output signal is less than or equal to the second comparison level and greater than or equal to the third comparison level after the expected phase.

21. A test method for testing a device under test that outputs, as an output signal, an amplitude-phase modulated signal having a level and a transition point phase selected from among a plurality of levels and a plurality of phases according to transmission data, the test method comprising:

outputting a test signal to the device under test;

generating an expected level, which is an expected value for a level of the output signal to be output from the device under test in response to the test signal, and an expected phase, which is an expected value for the transition point phase of the output signal;

comparing the output signal to a first comparison level, which is greater than the expected level, and to a second comparison level, which is less than the expected level, before the expected phase, and compares the output signal to a third comparison level, which is less than the expected level, after the expected phase; and judging that the output signal matches the expected values on a condition that (i) the output signal is less than or equal to the first comparison level and greater than or equal to the second comparison level before the expected phase and (ii) the output signal is less than or equal to the third comparison level after the expected phase.

22. A demodulation method for demodulating an amplitude-phase modulated signal that has a level and a transition point phase selected from among a plurality of levels and phases according to transmission data, the demodulation method comprising:

outputting a plurality of level comparison results obtained by comparing, for each of the levels that the received amplitude-phase modulated signal can have, (i) the amplitude-phase modulated signal to (ii) each of a first comparison level, which is less than the corresponding level, and a second comparison level, which is greater than the corresponding level;

acquiring the level comparison results obtained by the level comparison circuit, for each of the phases that the amplitude-phase modulated signal can have, at each of a first comparison timing, which is before the corresponding phase, and a second comparison timing, which is after the corresponding phase;

detecting a level and a transition point phase that cause the amplitude-phase modulated signal to be less than or equal to the first comparison level at the first comparison timing and to be less than or equal to the second comparison level and greater than or equal to the first comparison level at the second comparison timing, based on the acquired level comparison results; and outputting data corresponding to the detected level and transition point.

23. A demodulation method for demodulating an amplitude-phase modulated signal that has a level and a transition point phase selected from among a plurality of levels and phases according to transmission data, the demodulation method comprising:

outputting a plurality of level comparison results obtained by comparing, for each of the levels that the received amplitude-phase modulated signal can have, (i) the amplitude-phase modulated signal to (ii) each of a first comparison level, which is less than the corresponding level, and a second comparison level, which is greater than the corresponding level;

acquiring the level comparison results obtained by the level comparison circuit, for each of the phases that the amplitude-phase modulated signal can have, at each of a first comparison timing, which is after the corresponding phase, and a second comparison timing, which is before the corresponding phase;

detecting a level and a transition point phase that cause the amplitude-phase modulated signal to be less than or equal to the first comparison level at the first comparison timing and to be less than or equal to the second comparison level and greater than or equal to the first comparison level at the second comparison timing, based on the acquired level comparison results; and outputting data corresponding to the detected level and transition point.

24. An electronic device comprising:

a circuit under test that outputs, as an output signal, an amplitude-phase modulated signal having a level and a transition point phase selected from among a plurality of levels and a plurality of phases according to transmission data; and a test circuit that tests the circuit under test, wherein the test circuit includes:

a test signal output section that outputs a test signal to the circuit under test;

a pattern generating section that generates an expected level, which is an expected value for a level of the output signal to be output from the circuit under test in response to the test signal, and an expected phase, which is an expected value for the transition point phase of the output signal;

a comparing section that compares the output signal to a first comparison level, which is less than the expected level, before the expected phase, and compares the output signal to a second comparison level, which is greater than the expected level, and to a third comparison level, which is less than the expected level, after the expected phase; and a judging section that judges that the output signal matches the expected values on a condition that (i) the output signal is less than or equal to the first comparison level before the expected phase and (ii) the output signal is less than or equal to the second comparison level and greater than or equal to the third comparison level after the expected phase.

* * * * *